United States Patent
Ayub et al.

(10) Patent No.: US 11,349,174 B2
(45) Date of Patent: *May 31, 2022

(54) FLEXIBLE BATTERY MATRIX FOR A CONFORMAL WEARABLE BATTERY

(71) Applicant: Inventus Power, Inc., Woodridge, IL (US)

(72) Inventors: Ilyas Ayub, Naperville, IL (US); William Mark Batts, Elburn, IL (US); Timothy James Vallaro, Batavia, IL (US); Elijah Brett Goldin, Chicago, IL (US); Anvin Joe Manadan, Woodridge, IL (US)

(73) Assignee: Inventus Power, Inc., Woodridge, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/085,928

(22) Filed: Oct. 30, 2020

(65) Prior Publication Data

US 2022/0102803 A1     Mar. 31, 2022

Related U.S. Application Data

(63) Continuation of application No. 17/085,864, filed on Oct. 30, 2020, now Pat. No. 10,980,116, and a
(Continued)

(51) Int. Cl.
*H01M 50/238*     (2021.01)
*H05K 1/02*       (2006.01)
(Continued)

(52) U.S. Cl.
CPC ..... *H01M 50/238* (2021.01); *H01M 10/0525* (2013.01); *H01M 10/425* (2013.01);
(Continued)

(58) Field of Classification Search
CPC ............. H01M 50/238; H01M 50/211; H01M 10/0525; H01M 50/519; H01M 10/482;
(Continued)

(56) References Cited

U.S. PATENT DOCUMENTS 3,993,507 A     11/1976   Hardigg
4,053,685 A     10/1977   Rowley et al.
(Continued)

FOREIGN PATENT DOCUMENTS

CN     201922162396         7/2020
KR     20080056978 A        6/2008
(Continued)

OTHER PUBLICATIONS

Rogers Corporation, "Poron® ShockSeal™ 4790-79 Foams," visited on Nov. 2, 2020 at <https://rogerscorp.com/Elastomeric%20Material%20Solutions/PORON%20Industrial%20Polyurethanes/PORON%20ShockSeal%204790%2079%20Foams>, 3 pp.
(Continued)

*Primary Examiner* — Tuan T Dinh
(74) *Attorney, Agent, or Firm* — Banner & Witcoff, Ltd.

(57) ABSTRACT

A matrix of battery cell modules includes a flexible printed circuit board assembly (PCBA) for a conformal wearable battery (CWB) with a plurality of attachment sections for each of a plurality of battery cells that are arranged in a grid-like pattern on a same side of the flexible PCBA. Each battery cell may be joined with a flexible PCB via a welding process. The flexible PCBA is configured to fold along a bend axis so that the flexible PCBA is folded approximately in half. When affixed to the flexible PCBA, the plurality of battery cell modules and a circuitry module form a grid of physical components. When folded, the flexible PCBA forms a three-dimensional grid of physical components comprising at least the battery cell modules.

20 Claims, 26 Drawing Sheets

Related U.S. Application Data continuation-in-part of application No. 17/038,287, filed on Sep. 30, 2020, now Pat. No. 11,064,604, said application No. 17/085,864 is a continuation-in-part of application No. 17/038,287, filed on Sep. 30, 2020, now Pat. No. 11,064,604.

(51) Int. Cl.

| | | |
|---|---|---|
| *H05K 1/11* | (2006.01) | |
| *H01M 10/0525* | (2010.01) | |
| *H01M 50/247* | (2021.01) | |
| *H01M 10/42* | (2006.01) | |
| *H01M 50/519* | (2021.01) | |
| *H01M 10/48* | (2006.01) | |
| *H01M 50/211* | (2021.01) | |

(52) U.S. Cl.
CPC ....... *H01M 10/482* (2013.01); *H01M 50/211* (2021.01); *H01M 50/247* (2021.01); *H01M 50/519* (2021.01); *H05K 1/028* (2013.01); *H05K 1/111* (2013.01); *H05K 1/118* (2013.01); *H01M 2010/4271* (2013.01); *H01M 2220/30* (2013.01); *H05K 2201/10037* (2013.01)

(58) Field of Classification Search
CPC ............. H01M 10/425; H01M 50/247; H01M 2010/4271; H01M 2220/30; H05K 1/118; H05K 1/111; H05K 1/028; H05K 2201/10037
USPC ...... 429/7; 361/749, 775, 803; 174/254–260
See application file for complete search history.

(56) References Cited

U.S. PATENT DOCUMENTS

| | | | |
|---|---|---|---|
| 4,346,151 | A | 8/1982 | Uba et al. |
| 4,658,498 | A | 4/1987 | Yamaura et al. |
| 6,376,126 | B1 | 4/2002 | Faust et al. |
| 6,410,184 | B1 | 6/2002 | Horiuchi et al. |
| 6,528,204 | B1 | 3/2003 | Hikmet et al. |
| 6,773,848 | B1 | 8/2004 | Nortoft et al. |
| 7,545,649 | B2 | 6/2009 | Tan |
| 8,192,863 | B2 | 6/2012 | Best et al. |
| 8,767,405 | B2 | 7/2014 | Tokuda et al. |
| 8,795,880 | B2 | 8/2014 | Matsubara |
| 8,860,372 | B2 | 10/2014 | Guang et al. |
| 8,927,137 | B2 | 1/2015 | Ayub et al. |
| 9,564,761 | B2 | 2/2017 | Hopfer, III et al. |
| 9,640,831 | B2 | 5/2017 | Tajima et al. |
| 9,660,225 | B2 | 5/2017 | Miyake |
| 9,755,279 | B2 | 9/2017 | Moon |
| 9,756,733 | B2 | 9/2017 | Drzaic et al. |
| 9,780,421 | B2 | 10/2017 | Palanchon et al. |
| 9,843,073 | B2 | 12/2017 | Yoneda et al. |
| 9,923,186 | B2 | 3/2018 | Tsunaki et al. |
| 9,941,506 | B2 | 4/2018 | Hiroki et al. |
| 10,056,584 | B2 | 8/2018 | Hwang |
| 10,134,528 | B2 | 11/2018 | Stockman |
| 10,224,517 | B2 | 3/2019 | Kimura |
| 10,236,492 | B2 | 3/2019 | Miyake |
| 10,320,025 | B2 | 6/2019 | Hiroki et al. |
| 10,388,939 | B2 | 8/2019 | Urano et al. |
| 10,686,167 | B2 | 6/2020 | Goto et al. |
| 10,950,913 | B1 | 3/2021 | Goldin et al. |
| 11,108,105 | B2 | 8/2021 | Takahashi et al. |
| 2002/0017700 | A1 | 2/2002 | Mori et al. |
| 2002/0127362 | A1* | 9/2002 | Jansen .................... B60L 50/64 428/40.1 |
| 2004/0009334 | A1 | 1/2004 | Miyamoto et al. |
| 2005/0253553 | A1 | 11/2005 | Phillips et al. |
| 2006/0210841 | A1 | 9/2006 | Wallace et al. |
| 2008/0241677 | A1 | 10/2008 | Garcia Alberola |
| 2008/0241680 | A1 | 10/2008 | Lee et al. |
| 2009/0253034 | A1 | 10/2009 | Nedelec |
| 2009/0291361 | A1 | 11/2009 | Scorziello |
| 2013/0295434 | A1* | 11/2013 | Ayub .................. H01M 50/209 429/157 |
| 2014/0212695 | A1 | 7/2014 | Lane et al. |
| 2014/0216814 | A1 | 8/2014 | Suzuki |
| 2015/0044511 | A1 | 2/2015 | Kim et al. |
| 2015/0093982 | A1 | 4/2015 | Bailey |
| 2015/0194697 | A1* | 7/2015 | Hung ................ H01M 10/0585 429/158 |
| 2015/0280186 | A1* | 10/2015 | Fan ..................... H01M 50/502 429/159 |
| 2015/0311495 | A1 | 10/2015 | Wang |
| 2016/0003463 | A1 | 1/2016 | Rodinger et al. |
| 2016/0156012 | A1 | 6/2016 | Takahashi et al. |
| 2016/0218387 | A1 | 7/2016 | Tajima |
| 2016/0233695 | A1* | 8/2016 | Hopfer, III ............. H01M 6/46 |
| 2017/0018784 | A1 | 1/2017 | Yun et al. |
| 2017/0025669 | A1 | 1/2017 | Urano et al. |
| 2017/0079139 | A1 | 3/2017 | Wu |
| 2018/0026235 | A1 | 1/2018 | Akhmad |
| 2018/0062197 | A1 | 3/2018 | Thiel et al. |
| 2018/0083233 | A1* | 3/2018 | Young .................. H01M 50/10 |
| 2018/0175346 | A1 | 6/2018 | Schmid-Schoenbein |
| 2018/0223070 | A1 | 8/2018 | O'Neil et al. |
| 2018/0261900 | A1* | 9/2018 | Kim ........................ H02H 7/18 |
| 2018/0301741 | A1 | 10/2018 | Kumar et al. |
| 2019/0044197 | A1 | 2/2019 | Ota et al. |
| 2019/0088979 | A1 | 3/2019 | Grady et al. |
| 2019/0090350 | A1 | 3/2019 | Kumar |
| 2019/0237832 | A1 | 8/2019 | Ju et al. |
| 2019/0305303 | A1* | 10/2019 | Yebka ................ H01M 50/209 |
| 2019/0326647 | A1 | 10/2019 | Kawai et al. |
| 2020/0127259 | A1* | 4/2020 | Yoshida ............. H01M 10/425 |
| 2020/0227693 | A1 | 7/2020 | Enomoto |
| 2020/0243808 | A1 | 7/2020 | Harutyunyan et al. |
| 2020/0245495 | A1 | 7/2020 | Yi et al. |
| 2020/0403566 | A1* | 12/2020 | Yamaai .................. H02S 40/34 |

FOREIGN PATENT DOCUMENTS

| | | |
|---|---|---|
| WO | 08023199 A1 | 2/2008 |
| WO | 17209052 A1 | 12/2017 |
| WO | 2019/025235 A1 | 2/2019 |

OTHER PUBLICATIONS

Inventus Power, "Conformal Wearable Batteries Safe, 'Flexible, Wearable Power Designed to Increase Mission Effectiveness'," visited on Nov. 4, 2020 at <https://inventuspower.com/conformal-wearable-batteries/>, pp. 3.

Rebecca Cragun, et al., "Li-Ion Conformal Wearable Battery," EaglePicher Technologies, LLC visited on Feb. 9, 2020 at <http://www.powersourcesconference.com/Power%20Sources%202018%20Digest/docs/34-2.pdf>, pp. 577-580.

Eaglepicher Technologies, "Rechargeable Conformal Battery", visited on Feb. 9, 2020 at <https://www.eaglepicher.com/sites/default/files/SLB-101%20061419.pdf>, pp. 2.

Jul. 1, 2021—(WO) ISR & WO—App. No. PCT/US2021/022377.

* cited by examiner

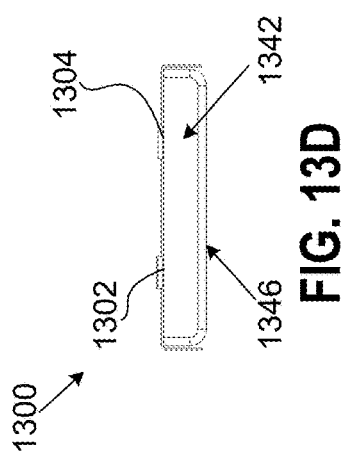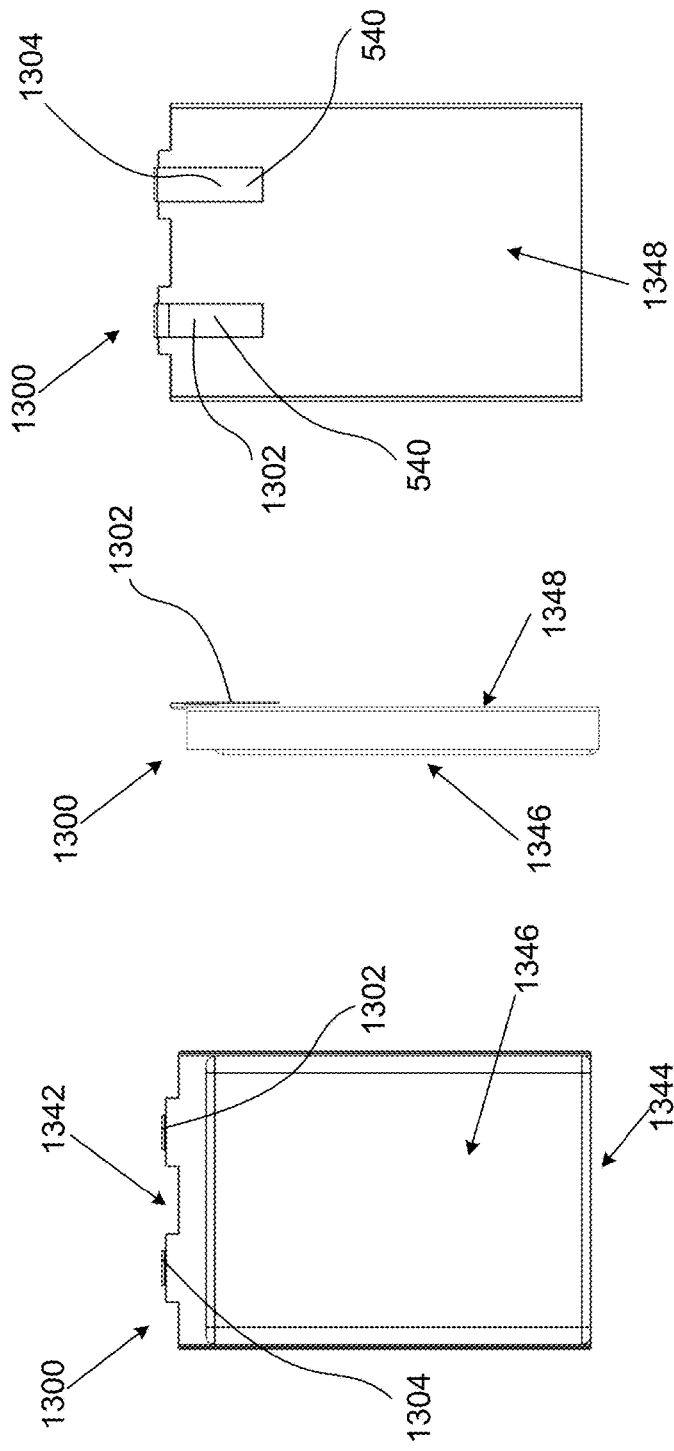

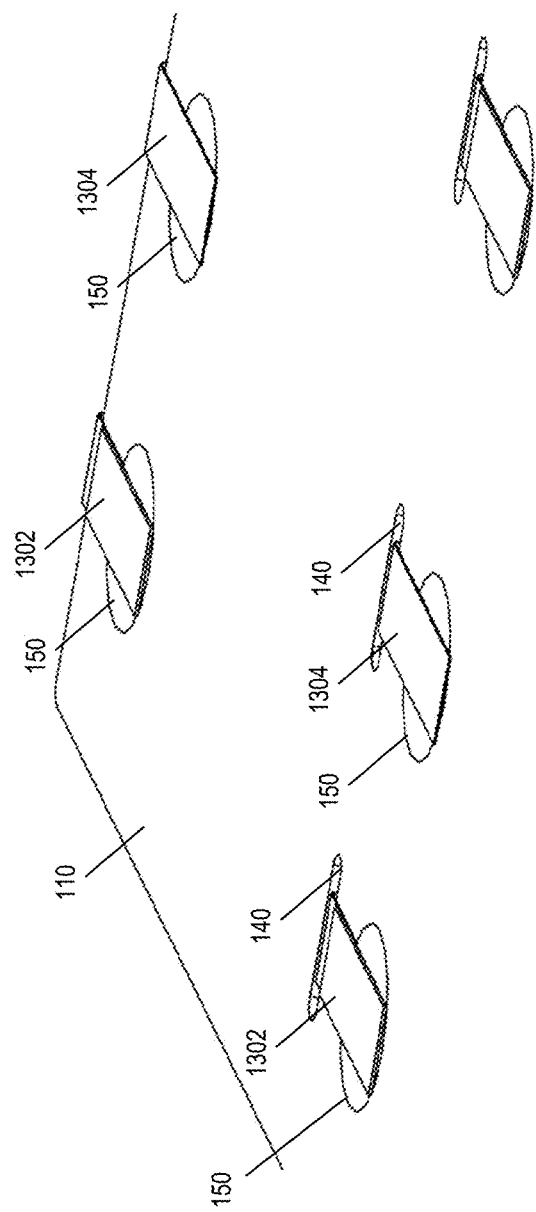
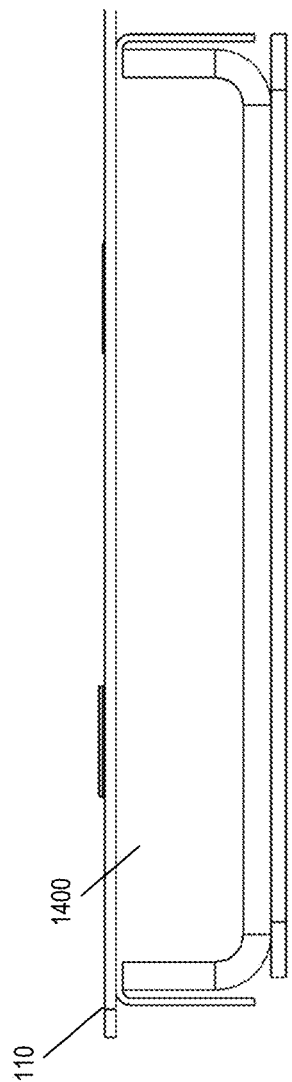
FIG. 15A
FIG. 15B

FLEXIBLE BATTERY MATRIX FOR A CONFORMAL WEARABLE BATTERY

CROSS-REFERENCE TO RELATED APPLICATIONS

This application claims the benefit of priority as both a continuation of U.S. application Ser. No. 17/085,864, filed on Oct. 30, 2020, now U.S. Pat. No. 10,980,116, which is a continuation-in-part of U.S. patent application Ser. No. 17/038,287 filed on Sep. 30, 2020, now U.S. Pat. No. 11,064,604; and as a continuation-in-part of U.S. patent application Ser. No. 17/038,287 filed on Sep. 30, 2020, now U.S. Pat. No. 11,064,604, all of which are incorporated by reference in their entireties. This application is related to U.S. application Ser. No. 17/085,873 filed on Oct. 30, 2020, entitled "Housing for a Conformal Wearable Battery," now U.S. Pat. No. 11,081,755, U.S. application Ser. No. 17/085,991 filed on Oct. 30, 2020, entitled "Housing for a Conformal Wearable Battery," now abandoned and U.S. application Ser. No. 17/086,132 filed on Oct. 30, 2020, entitled "Impact Absorbing Member for a Conformal Wearable Battery," now U.S. Pat. No. 10,950,913 which are being filed concurrently with this application and all of which are herein incorporated by reference in their entirety.

FIELD

Aspects described herein generally relate to portable electrical power storage systems. More specifically, aspects of this disclosure relate to flexible printed circuit boards providing conductive paths for a matrix of battery cells.

BACKGROUND

Portable battery systems may be utilized to provide mobile and/or remote location electrical power. Integrated communications equipment and/or weapons gear utilized, for example, by law enforcement and/or military personnel requires increasingly high levels of power storage carried proximate the user's body. Methods of increasing power storage capability in a device, such as a conformal wearable battery (CWB) is to include additional battery cells and/or use higher capacity battery cells. However, these solutions may unacceptably increase the size and/or weight of the resulting systems, reducing mobility.

In addition, batteries may come in different shapes and sizes depending on their intended usage. Some batteries may be arranged as packages of battery cells that are assembled together to provide a predetermined power output. These battery packages may be arranged in a durable and sealed housing to protect the batteries from damage. In some instances, the battery packages may be desired to flex or bend to accommodate their intended usage.

SUMMARY

Aspects of the disclosure provide solutions that address and overcome technical problems associated with minimizing size of a portable battery system (e.g. a conformal wearable battery system).

A need has been recognized within the mobile electrical power storage industry for increasing power capacity while improving an overall user safety of these systems while simultaneously reducing their size and weight.

A matrix of battery cell modules includes a flexible printed circuit board assembly (PCBA) for a conformal wearable battery (CWB) with a plurality of attachment sections for each of a plurality of battery cells that are arranged in a grid-like pattern on a same side of the flexible PCBA. Control and/or monitoring circuitry for the CWB may be provided in a circuitry module. The flexible PCBA is configured to fold along a bend axis so that the flexible PCBA is folded approximately in half. When affixed to the flexible PCBA, the plurality of battery cell modules and the circuitry module form a grid of physical components. When folded, the flexible PCBA forms a three-dimensional grid of physical components comprising at least the battery cell modules.

Aspects of this disclosure may relate to a conformal wearable battery that may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

In some cases, the conformal wearable battery may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly. Further, the conformal wearable battery may include a plurality of battery cells, at least one circuitry module configured to control and monitor charging and discharging of the plurality of battery cells, and a flexible printed circuit board assembly (PCBA). The flexible PCBA may include a plurality of physical connection sections disposed in a grid like pattern, wherein each of the plurality of battery cells and the at least one circuitry module is physically affixed to the flexible PCBA at a corresponding physical connection section of the plurality of physical connection sections.

Aspects of this disclosure may relate to a conformal wearable battery that may include a flexible PCBA that includes a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly. The conformal wearable battery may include a plurality of battery cells and at least one circuitry module that, when affixed to the flexible PCBA, forms a matrix of physical components. The matrix of physical components may be a matrix of at least two rows and at least two columns. The conformal wearable battery may further include at least one connector configured to provide an electrical power connection from internal circuitry of the conformal wearable battery to an external device to be powered. Aspects of this disclosure may relate to a conformal wearable that may include the plurality of battery cells, where the at least one connector, and the at least one circuitry module, when affixed to the flexible PCBA, comprises a matrix of physical components.

Aspects of this disclosure may relate to a conformal wearable battery that may comprise a bend axis that is a center of the grid like pattern of the physical connection sections when the flexible PCBA is unfolded. The conformal wearable battery of the illustrative example may include a flexible PCBA having each of the plurality of battery cells physically attached to a first side of the flexible PCBA. The conformal wearable battery may include the flexible PCBA having each of the plurality of battery cells physically attached to a first side of the flexible PCBA and each of the plurality of battery cells electrically connected to the flexible PCBA on a second side of the flexible PCBA that is opposite the first side. The conformal wearable battery of the illustrative example may include the flexible PCBA having the plurality of battery cells disposed on an outside surface of the flexible PCBA, when the flexible PCBA is in a folded configuration.

Aspects of this disclosure may relate to a plurality of battery cells that are arranged in a three-dimensional grid pattern. The conformal wearable battery of the illustrative example may include a sealed flexible housing wherein the flexible PCBA is disposed within an interior cavity of the sealed flexible housing and wherein the flexible PCBA is in a folded configuration.

Aspects of this disclosure may relate to a system that may include a plurality of battery cell modules and a flexible printed circuit board assembly (PCBA). The flexible PCBA may further include a plurality of battery cell connection sections disposed in a grid-like pattern along a first surface of the flexible PCBA where each of the plurality of battery cell modules is electrically attached to the flexible PCBA on a second surface of the flexible PCBA in a grid-like pattern, wherein the second surface is opposite the first surface. Aspects of this disclosure may relate to the system that may further include a housing, wherein the flexible PCBA, when in a folded configuration, is located within the housing. Aspects of this disclosure may relate to the illustrative system that may include a plurality of battery cell modules, where each of the plurality of battery cell modules includes a battery cell and an attenuating member made of a resilient material. Each battery cell may be a lithium-ion battery cell. The illustrative system may include a plurality of battery cells arranged in a three-dimensional grid pattern when the flexible PCBA is in a folded configuration.

Aspects of this disclosure may relate to an illustrative flexible printed circuit board assembly (PCBA) may include a plurality of battery modules physically affixed to the flexible PCBA, where the plurality of battery modules is arranged in a grid-like pattern and a bend axis near an approximate mid-point of the flexible PCBA. When the flexible PCBA is bent along the bend axis, the flexible PCBA is in a folded configuration and, when the flexible PCBA is in a folded configuration, the plurality of battery modules is disposed in a three-dimensional grid-like pattern.

Aspects of this disclosure may relate to a plurality of flexible sections of the flexible PCBA, were the flexible sections may allow for the flexible PCBA to flex between adjacent rows and adjacent columns of battery modules. The illustrative flexible PCBA may include at least one circuitry module that comprises a portion of the grid-like pattern.

Additional aspects of this disclosure may relate to a conformal wearable battery (CWB) including a plurality of battery cells, where each battery cell includes a pair of electrically conductive elements that correspond to either a cathode or an anode of each battery cell. The CWB may also include a flexible printed circuit board (PCB) that includes a plurality of physical connection sections disposed in a grid like pattern on a first side of the flexible PCB, where each of the plurality of battery cells is disposed at a corresponding physical connection section of the plurality of physical connection sections. The flexible PCB may further include a plurality of electrical connection pads linearly disposed on a second side opposite the first side of the flexible PCB, the plurality of electrical connection pads comprising an electrically conductive surface coating. The pair of electrically conductive elements may extend substantially parallel to and along the second side of the flexible PCB, and each electrically conductive elements may be connected to a corresponding electrical connection pad of the plurality of electrical connection pads on the second side of the flexible PCB forming an electrical connection.

Aspects of the disclosure may relate to the plurality of battery cells comprising pouch cell packaged polymer lithium-ion battery cells where each battery cell of the plurality of battery cells is physically attached to the first side of the flexible PCB.

Aspects of the disclosure may relate to a conformal wearable battery where the flexible PCB includes a plurality of cutouts extending through the flexible PCB, where at least one cutout of the plurality of cutouts is located adjacent to an electrical connection pad of the plurality of electrical connection pads. In some cases, each conductive element of the pair of electrically conductive elements may extend through a corresponding cutout of the plurality of cutouts.

Aspects of the disclosure may relate to a conformal wearable battery where the electrically conductive surface coating comprises an electroless nickel immersion gold (ENIG) surface coating and/or a lead-free immersion silver surface coating.

Aspects of the disclosure may relate to forming an electrical connection between each electrically conductive element of the pair of electrically conductive elements and the corresponding electrical connection pad of the plurality of electrical connection pads with a weld. In some cases, the weld is formed using a laser welding process. In some cases, the weld is formed using an ultrasonic welding process.

Aspects of the disclosure may relate to a conformal wearable battery where a connection pad of the plurality of electrical connection pads has a width that is within a range of 1.8 times and 3 times a width of an electrically conductive element of the pair of electrically conductive elements and/or where a height of an electrical connection is within a range of 1.2 to 3 times a thickness of an electrically conductive element of the pair of electrically conductive elements. In some cases, a connection pad of the plurality of electrical connection pads may have a circular shape with a diameter that is within a range of 1.8 times and 3 times a width of an electrically conductive element of the pair of electrically conductive elements.

Aspects of the disclosure may relate to a system including a first plurality of battery cells and a second plurality of battery cells and a flexible printed circuit board (PCB). In some cases, the first battery cell of the first plurality of battery cell includes a first pair of electrically conductive elements and the second battery cell of the second plurality of battery cell includes a second pair of electrically conductive elements. The flexible PCB may include a plurality of battery cell connection sections disposed in a grid-like pattern along a first surface of the flexible PCB, a plurality of cutouts disposed adjacent and parallel to an edge of the plurality of battery cell connection sections, and a plurality of electrical connection pads disposed on a second surface of the flexible PCB opposite the first surface. In some cases, the plurality of cutouts may be arranged as multiple pairs of cutouts arranged adjacent a majority of the plurality of battery cell connection sections and/or a majority of the plurality of electrical connection pads may be arranged adjacent the plurality of cutouts, and where the plurality of electrical connection pads may include an electrically conductive surface coating. In some cases, an electrically conductive element of the first pair of electrically conductive elements may wrap around an edge of the flexible PCB and may extend along the second surface of the flexible PCB such that the electrically conductive element of the first pair of electrically conductive elements may be connected to a corresponding electrical connection pad of the plurality of electrical connection pads forming a first electrical connection. In some cases, an electrically conductive element of the second pair of electrically conductive elements may extend through a cutout of the plurality of cutouts such that each electrically conductive element of the second pair of electrically conductive elements may be connected to a corresponding electrical connection pad of the plurality electrical connection pads forming a second electrical connection.

Aspects of this disclosure may relate to a flexible printed circuit board assembly (PCBA) that may include a flexible printed circuit board (PCB) and a plurality of battery cell modules physically affixed to the first side of the flexible PCB. The flexible PCBA may have a first side and a second side opposite the first side, where a plurality of electrical connection pads may be disposed on the second side of the flexible PCB. The plurality of electrical connection pads may be arranged in multiple pairs of electrical connection pads. In some cases, the plurality of electrical connection pads may include an electrically conductive surface coating. The flexible PCBA may include a plurality of cutouts linearly disposed in the flexible PCB and adjacent to corresponding electrical connection pads. In some cases, the plurality of battery cell modules may be arranged in a grid-like pattern and comprise pouch cell packaged polymer lithium-ion and each battery cell module of the plurality of battery cell modules may include a pair of electrically conductive elements that extend substantially parallel to the second side of the flexible PCB and may be configured to connect to corresponding electrical connection pads of the plurality of electrical connection pads to form an electrical connection for each battery cell module.

BRIEF DESCRIPTION OF THE DRAWINGS

The present disclosure is illustrated by way of example and not limited in the accompanying figures in which like reference numerals indicate similar elements and in which:

FIGS. 13A-13D show different views of an illustrative battery cell 1300 according to aspects of the disclosure;

FIGS. 15A-15E show partial illustrative views of at least one battery cell module being attached to the flexible PCBA according to aspects of the disclosure;

DETAILED DESCRIPTION

Figure 1:
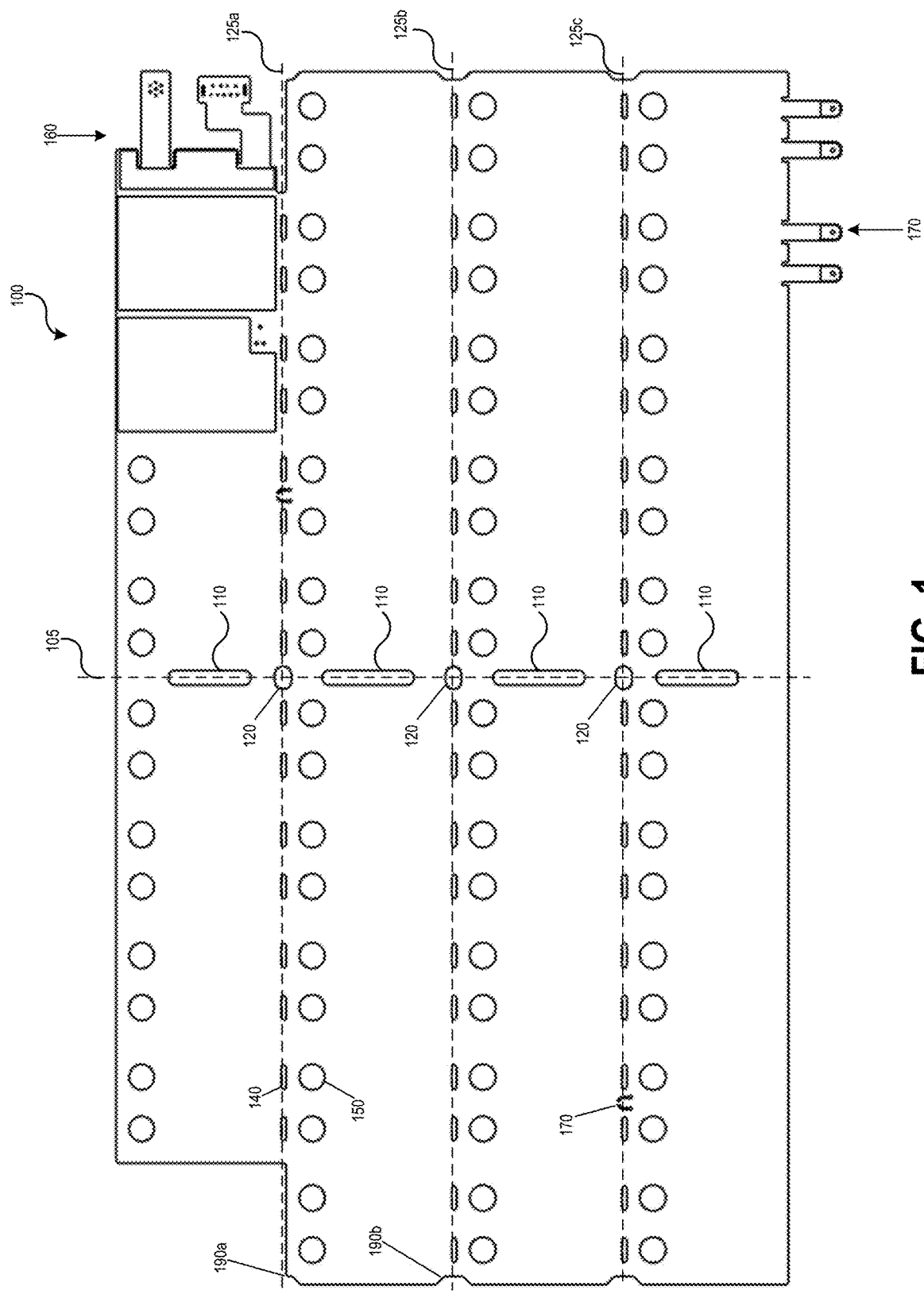
FIG. 1 shows a first view of an illustrative flexible printed circuit board for an illustrative conformal wearable battery system according to aspects of the present disclosure.

In the following description of various illustrative arrangements, reference is made to the accompanying drawings, which form a part hereof, and in which is shown, by way of illustration, various arrangements in which aspects of the disclosure may be practiced. It is to be understood that other arrangements may be utilized, and structural and functional modifications may be made, without departing from the scope of the present disclosure. It is noted that the accompanying drawings may not be drawn to scale.

It is noted that various connections between elements are discussed in the following description. It is noted that these connections are general and, unless specified otherwise, may be direct or indirect, and that the specification is not intended to be limiting in this respect.

A rechargeable conformable wearable battery (CWB) assembly may be worn by a user to power electronic devices that the user carries. The CWB assembly may be subjected to environmental conditions that the user is also subjected to. The CWB may be subjected to a multitude of environmental conditions such as harsh shock and vibration, moisture exposure, and extreme temperatures. The CWB may have a sealed housing that is sealed to facilitate longer battery life and utility for the user regardless of environmental conditions that the CWB may encounter. To provide a desired power output, the CWB may include a plurality of battery cells, each with a rated power capacity and when electrically connected, may allow the CWB to provide a desired power output and within a specified size range and/or weight range.

A CWB may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing (e.g., a pouch, a metal enclosure, etc.) separate from other battery cells. A battery cell as described herein may include a plurality of individual battery cell elements that are electrically connected together to form a compound battery cell that electrically performs as a single unit. Each of the battery cell housings may be physically connected to adjacent battery cell housings by flexible elements (e.g., a flexible printed circuit board), thereby facilitating a surface outline or shape of the array of battery cells to generally conform to a surface outline or shape of a user wearing the CWB. For example, the CWB may include one or more flex lines along which the CWB may flexibly conform to a shape of an object adjacent to the CWB, such as a portion of a user's body. One or more of the battery cell housings may include a positive-charge electrical terminal and a negative-charge electrical terminal that are electrically connected with the battery cell within an interior of the battery cell housing and provide electrical power to electrical devices disposed exterior to the battery cell housing. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB may include a set of positive-charge and negative-charge electrical terminals that are shared among the plurality of the battery cells of the array of battery cells. The plurality of the battery cells may be electrically coupled together, for example, in series or in parallel.

In some cases, the battery cell may be formed of electrodes and a solid electrolyte that are stacked in layers or laminations and enclosed in a foil envelope housing, which is then sealed. The positive-charge terminal and the negative-charge terminal may each include a conductive region that passes between the interior of the cell housing and the exterior of the cell housing at an outer wall of the casing. The conductive region may be affixed and electrically connected to the battery cell in an interior of the cell housing at one end, pass through the sealed wall of the casing, and affix to conductive elements that electrically couples with electrical devices at an exterior of the cell housing.

The CWB housing may be formed of a molded casing that may be created through a molding process, such as an injection molding process. The molded CWB housing may be formed of a polymeric material, for example. The CWB housing may be sealed to prevent ingress of solid material and/or liquid material, for example, according to an IP67 rating, IP68 rating, or other ingress protection rating. In some cases, the CWB housing may be created through connecting at least two housing portions into a complete sealed housing to encase the battery cells within the casing. The positive-charge terminal and the negative-charge terminal may each include a conductive region that passes between the interior of the CWB housing and the exterior of the CWB housing.

In some cases, the CWB may be provided in a form factor easily carried by a person, such as within a pocket or with other means of securing the CWB assembly to a person's clothing, uniform, or the like. To provide the specified power output, while also providing flexibility for conforming to a shape of person's body or equipment when carried, the matrix of battery cells may be arranged on, and affixed to, a flexible printed circuit board. To fit within the housing of the CWB assembly, the flexible printed circuit board assembly may be configured to be folded along an axis (e.g., a center line), such that battery cell modules may be on an exterior surface of the flexible printed circuit board assembly closest to the housing, while the electrical connections may be made on an interior surface of the folded printed circuit board assembly. An electrical insulator (e.g., foam, insulating tape, etc.) may be placed between the folded sections to provide electrical insulation for the electrical contacts.

FIG. 1 shows a first view of an illustrative flexible printed circuit board (PCB) 100 for an illustrative CWB according to aspects of the present disclosure. The flexible PCB may be configured to provide power and/or electrical signals from a plurality of battery cells and/or other components of a CWB. The flexible PCB 100 may be formed of one or more layers of a flexible polymer or plastic material, such as a polyimide or other such flexible substrate. In some cases, markings showing locations to facilitate placement of battery cells may be included on a surface of the flexible PCB 100, such as those formed through a silk-screening process, or other like method. Electrical conductors may be included in one or more layers of the flexible PCB. In some cases, electrical conductors may be configured as a conductive pattern (e.g., a copper overlay, a conductive ink, etc.) on the surface of the substrate of the flexible PCB 100. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an electroless nickel immersion gold (ENIG) finish, a lead-free immersion silver finish or other substances with improved conductive properties.

The flexible PCB 100 may be configured to bend along a bend line 105 located at or near a center line of the flexible PCB 100 such as to form a bend of a desired angle (e.g., a 180-degree bend). One or more elongated cut-outs may be disposed parallel to the bend line 105 (e.g., cut-out 110) and/or perpendicular to the bend line 105 (e.g., cut-out 120), where the cut-outs perpendicular to the bend line 105 may be aligned with a flex line (e.g., a flex line 125a, a flex line 125b, a flex line 125c, etc.) perpendicular to the bend line 105. In some cases, the flex line may correspond to a section of the flexible PCB 100 located between rows of components (e.g., battery cells) along which the CWB may bend during use. Such cut-outs may provide additional flexibility to the flexible PCB 100 to allow for easier formation of the desired bend angle (e.g., the 180-degree bend) such as by folding the right half of the flexible PCB 100 over the left half of the flexible PCB 100 and/or flexing along one or more adjacent flex lines. In the illustrative example, relief cuts, such as the cut-out 110 may be formed as a rounded elongated rectangular cutout and the cut-out 120, may be formed in a generally obround shape (e.g., two substantially semi-circular sections connected by a rectangular section). As mentioned, the elongated rounded rectangular cut-outs (e.g., cut-out 110) parallel to the bend line 105 may reduce stress on the plastic substrate when forming the about 180-degree bend. Additionally, the obround-shaped cut-outs (e.g., cut-out 120) may reduce stresses placed on the flexible PCB substrate during use, such as by reducing stresses along a line of deformation (e.g., the flex line 125$a$, a flex line 225$a$ of FIG. 2, etc.) between battery cells.

In some cases, additional cut-outs may be included to reduce stresses along the flex line (e.g., the flex line 125$a$, the flex line 125$b$, the flex line 125$c$), such as at an edge of the flexible PCB 100, such as a corner notch 190$a$ located near a corner formed in the edge of the flexible PCB 100 near a flex line and/or a notch 190$b$ located along an edge of the flexible PCB 100 and aligned near a flex line. By reducing the bending stress at locations along the bend line, a probability of a catastrophic failure of the substrate (e.g., cracking, delamination, and the like) is reduced. While cut-out 110 is shown as a rounded rectangular shape and the cut-out 120 is shown as an obround shape, other shapes may be used to remove weight and/or to reduce stress due to bending and/or flexing of the flexible PCB 100. While an obround shape is shown on the illustrative example, other cut shapes may be used. Such other shapes may include circular cuts which may be used, for example, for removing more weight, oval cuts which may provide additional stress relief, for example, based on the curves, elongated slots which, for example, may be similar to the rectangular cuts but with even more filet on corners that may reduce additional stresses, a dog-bone shape (e.g., two substantially circular sections connected by a rectangular section), and/or the like.

The flexible PCB 100 may also include a plurality of conductive pads (e.g., pads 150) to provide electrical connection for the cathode and anode of each battery module connected to the flexible PCB 100. For battery cells located near an edge of the flexible PCB 100, the cathode an anode connectors may be bent over the edge of the flexible PCB 100. For battery cells located away from the edge of the flexible PCB, a plurality of cut-outs (e.g., the cut-out 140) are located near a corresponding pad 150 to allow for solder or weld connection of the battery cathode or anode connector to the flexible PCB 100. Additionally, the flexible PCB 100 may include charging connection portion 190 that may be used to connect to one or more charging tabs on an exterior portion of a case of the conformal wearable battery enclosure and/or a flexible connector portion 160 that may include one or more flexible connectors to connect to additional circuitry, such as a control module, a display module, or the like). The flexible PCB 100 may also include one or more semi-circular cut-out sections 180 to provide an area of low mechanical stress at an interior portion of the flexible PCB 100. In some cases, an electrical component 280, shown in FIG. 2, (e.g., a thermistor) may be physically connected to the flexible PCB 100 in this area such that the electrical component does not receive stress loads while the CWB is flexed during use. Such stress loads, without the stress relief provided by the semi-circular cut-outs, may cause the electrical component to detach from the flexible PCB 100.

Figure 2:
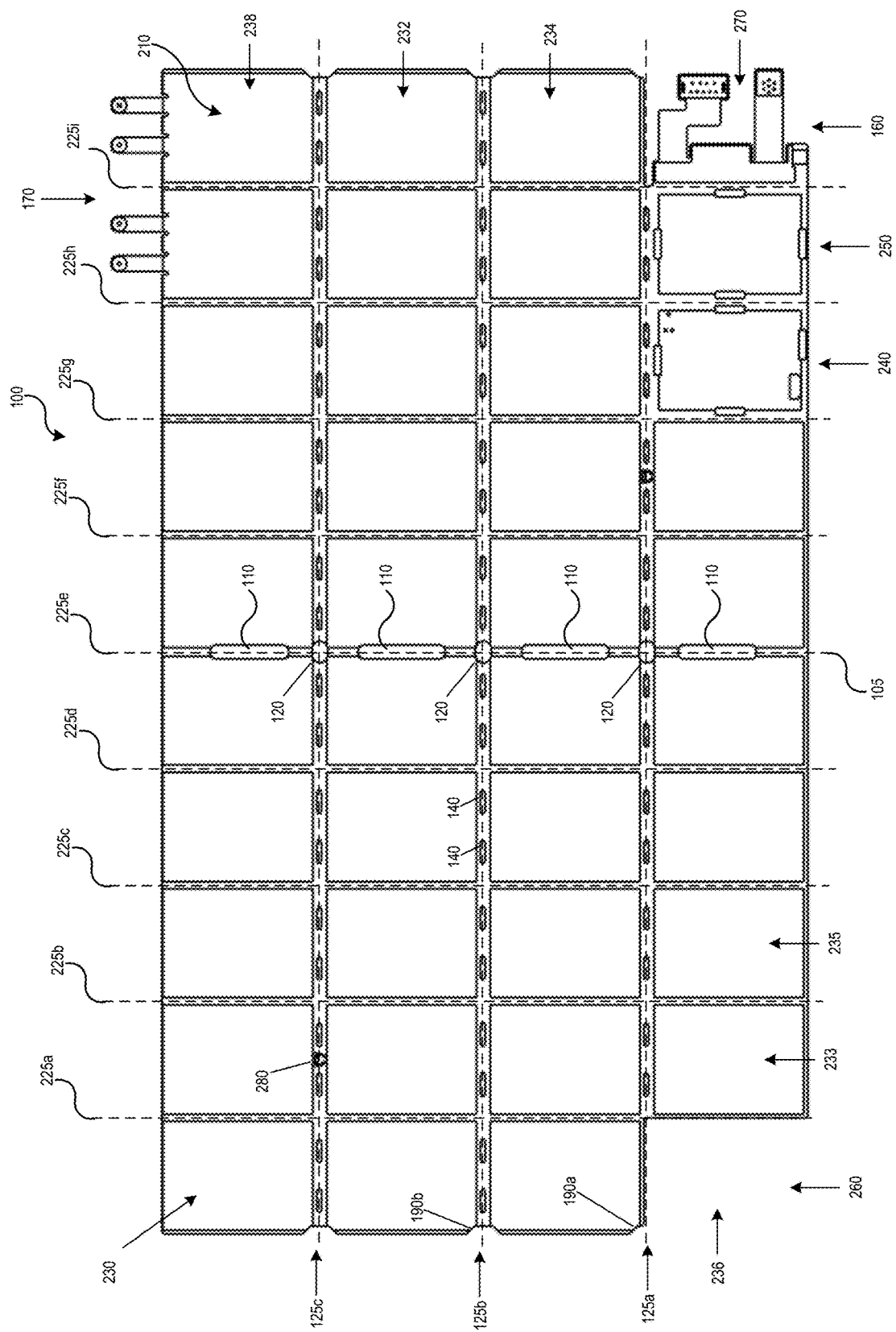
FIG. 2 shows a second view of the illustrative flexible printed circuit board for the illustrative conformal wearable battery system according to aspects of the present disclosure.

FIG. 2 shows second view of the illustrative flexible printed circuit board 100 for the illustrative conformal wearable battery system according to aspects of the present disclosure. In some cases, physical connection locations for each battery cell may be marked (e.g., battery cell location 210, 230, etc.). Additionally, one or more physical connection locations for electrical circuitry may be marked or unmarked (e.g., circuitry module location 240, circuitry module 250, etc.). The flexible PCB 100 may also include one or more cut-out areas of the flexible PCB 100 (e.g., cut out area 260, cut out area 270, etc.) to accommodate inclusion of electrical connectors (e.g., flexible connection portion 160, etc.), such as those provided to provide, and/or receive, information and/or electrical power to/from one or more external devices. In some cases, one or more of the battery cell connection locations and/or the connection locations for electrical circuitry may include a rigidizing material, or may be otherwise reinforced.

The battery cell locations, circuitry module locations, cut outs, and/or electrical connection locations may be provided in a matrix or grid pattern on an outward facing surface or front side of the flexible PCB 100. For example, the battery cell locations may be arranged in rows, such as battery cell row 232, battery cell row 234, and the like, an/or in columns, such as battery cell column 233, battery cell column 235, and the like. Additionally, one or more of the cut-out area 260, the cut-out area 270, the circuitry module location 240, the circuitry module 250, and the like may be aligned in a same row (e.g., row 236). In some cases, one or more of the cut-out areas, circuitry module areas, and/or electrical connection areas may be located in different rows and/or columns of the matrix or grid pattern. In some cases, a matrix or grid pattern may include a combination of one or more of the battery cell locations, the one or more circuitry module locations and/or the cut-out locations. In the illustrative configuration shown in FIG. 2, the matrix or grid pattern may include 36 battery cell locations, 2 circuitry module locations, and two cut-out locations, where one of the cut-out locations accommodates the flexible connection portion 160.

In some cases, each battery cell location 230 may be associated with a pair of cut-outs for the anode and cathode connections, as discussed above. Here, a battery cell module may be physically attached to the substrate of the flexible PCB 100, such as by use of an adhesive material (e.g., glue, tape, etc.) or other such bonding material. The cathode and anode connection tabs may be inserted through a corresponding cut-out 140 so that the connection tabs may be soldered, welded, or otherwise connected to the connection pad 150 on the opposite side of the flexible PCB 100. Additional to a plurality of battery cell locations (e.g., 36 battery cell locations), the flexible PCB 100 may include one or more locations, marked or unmarked on the flexible PCB 100, where electronic circuit modules may be attached, such as the electronic circuit location 240, the electronic circuit location 250, and the like. For example, electronic circuit modules may be physically attached to the substrate of the flexible PCB 100, such as by use of an adhesive material (e.g., glue, tape, etc.) or other such bonding material. Further, the flexible PCB 100 may include a cut-out section 260 that is of similar size to a battery cell location 230 that may also be inclusive of at least a portion of an area associated with one or more flex lines (e.g., a flex line 125$a$, a flex line 225b), and the like. The cut-out section 270 may be configured to correspond with the flexible connector portion 160.

In some cases, the electrical connection cut-outs (e.g., cut-out 140) and/or end cut outs (e.g., cut-out 190a, 190b) may be disposed near or offset from the flex line 125b between rows of battery cell locations 230 at a distance configured to reduce or eliminate stresses applied to the cell tabs (e.g., a cathode connection tab, an anode connection tab) of each battery cell. Because the battery cell locations are reinforced or otherwise stiffened by the battery modules, the flex lines 225a-i and 125a-c may allow for the CWB to be flexed within a designed range of motion, when in use. To provide stress relief along these flex lines between the rigid battery cell portions, the obround-shaped cut-outs 120 are disposed within each flex line 225 and may be aligned with a portion of the battery cell connection cut-outs (e.g., cut-out 140) and the edge cut-outs 190a, 190b may be aligned to the flex lines 225 and located at an edge of the flexible PCB 100.

Figure 3:
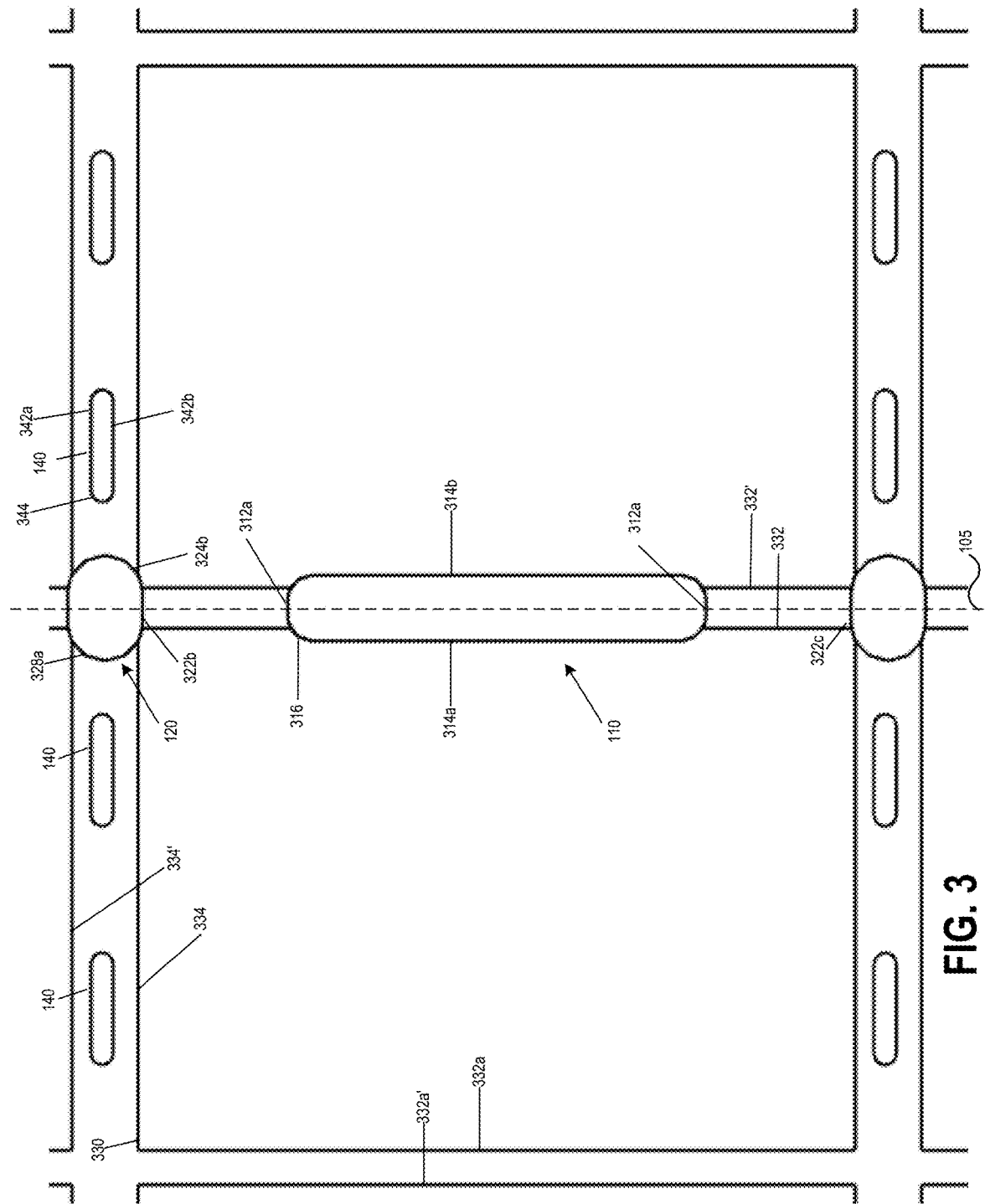
FIG. 3 shows a partial second view of the illustrative flexible printed circuit board including markings for placement of two battery modules.

FIG. 3 shows a partial second view of the illustrative flexible printed circuit board 100 including markings for placement of two battery modules, cut-outs through which battery cell tabs are placed for connection on the opposite side, and cut-outs providing strain relief along a center line and/or along a flex line perpendicular to the center line according to aspects of the present disclosure. As discussed above, the rectangular cut-out 110 may be disposed centered on and parallel to the bend line 105 at the center of the flexible PCB 100, where at least a portion of the cut-out 110 may be disposed underneath a battery cell module when installed. In an illustrative example, a battery cell connection area 330 may be about 50 mm in length along an edge 332 and about 35 mm in width along an edge 334. In some cases, along the flex line 105, the cut-out 110 may be located near a mid-point of the battery cell connection area 330.

In the illustrative example of FIG. 3, a first edge 312a of the cut-out 110 may be located at a first distance (e.g., about 11.5 mm) from a first edge of the battery cell connection area 330, the second edge 312b of the cut-out 110 may be located at a second distance (e.g., about 11.5 mm) from the second edge of the battery cell connection area 330, and the length of the cut-out 110 between the first edge 312a and the second edge 312b may be a first dimension (e.g., about 25 mm). A width of the cut-out between the left edge 314a and the right edge 314b may be a second dimension (e.g., about 4.5 mm), and a radius of each rounded corner 316 may be a third dimension (e.g., about 1.1 mm). The specific distances and/or dimension are given for illustrative purposes and other distances and/or dimensions may be contemplated within the scope of this disclosure.

The illustrative obround-shaped cut-out 120 may be formed as a rectangular area 322b connecting two semi-circular areas 328a and 328b. For example, the obround-shaped connector 120 may be centered on and perpendicular to the bend line 105. The rectangular area 322b may larger than the distance between adjacent battery cell connection areas. Each semi-circular area 238a and 328b may overlap at least a portion of adjacent battery connection areas.

The illustrative battery connection cut-out 140 may be formed as an elongated oval shape, such as an illustrative shape of about 1.5 mm high (e.g., between edge 342a and edge 342b) and having a distance of about 6 mm between a center point of each circular end portion (e.g., point 344) and an overall length of about 9 mm. In some cases, the edge 342b of the cut-out 140 may align with a center line through the obround shaped cut-out 120. Additionally, the obround-shaped cut-out 120 may be located a distance (e.g., about 4 mm) from the battery connection cut-out 140.

Spacing of the battery cell connection areas may be configured to allow for construction of the finished CWB and/or for a specified amount of movement (e.g., flexing, bending, etc.) of the CWB when in use. For example, the spacings of the battery cells relative to flex lines 225a-225i and/or flex lines 125a-125c may allow for an amount of flexing or bending of the CWB as defined in a specification such as, for example, MIL-PRF-32383/4A, while maintaining structural integrity. For example, the spacings of battery cell connection areas may allow for bending of the CWB such that a center section of the CWB to bend while the edges of the CWB are held stationary. In some cases, the edges of the CWB may pivot in the direction of the bend. Upon application of force to the center section of the CWB, e.g., at a distance equidistant between centerline edges of the CWB, the center portion of the CWB may flex up and/or down a specified distance (e.g., at least one inch, between 1 inch and two inches, etc.). For example, spacing of the battery cell connection areas 330 may be distributed as a grid or matrix pattern such that spacing between allows for uniform distribution of the adjacent battery cell connection areas, along column of battery cell location areas (e.g., column 235) and/or along rows of battery cell connection areas (e.g., row 234). In some cases, spacing of adjacent battery cell connection areas adjacent to a central flex line (e.g., flex line 105) may differ such as to allow for forming a 180-degree bend in the flexible PCB 100. In the illustrative example shown in FIG. 3, spacing of adjacent columns of battery cell connection areas (e.g., column 233, column 235) are illustrated in the spacing between sides 332a and 332a' of adjacent battery cell areas and has a distance of about 2.3 mm. As mentioned, to allow for formation of a 180-degree bend in the flexible PCB 100, spacing along a central line (e.g., flex line 105, flex line 225e) may be the same as those between other adjacent columns of battery cell connection areas or may be different. In the illustrative example of FIG. 3, spacing between side 332 and 332' may be about 2.68 mm. Spacing between adjacent rows of battery cell connection areas may be configured to allow for flexing and/or bending of the CWB and/or to facilitate electrical connection of a battery cell to the flexible PCB 100. In the illustrative example of FIG. 3, spacing of adjacent rows of battery cell location areas (the row 232, the row 234, the row 236, the row 238) are illustrated in the spacing between sides 334 and 334' of adjacent battery cell areas and has a distance of about 4.4 mm. The specific distances and/or dimension are given for illustrative purposes and other distances and/or dimensions may be contemplated within the scope of this disclosure.

Figure 4:
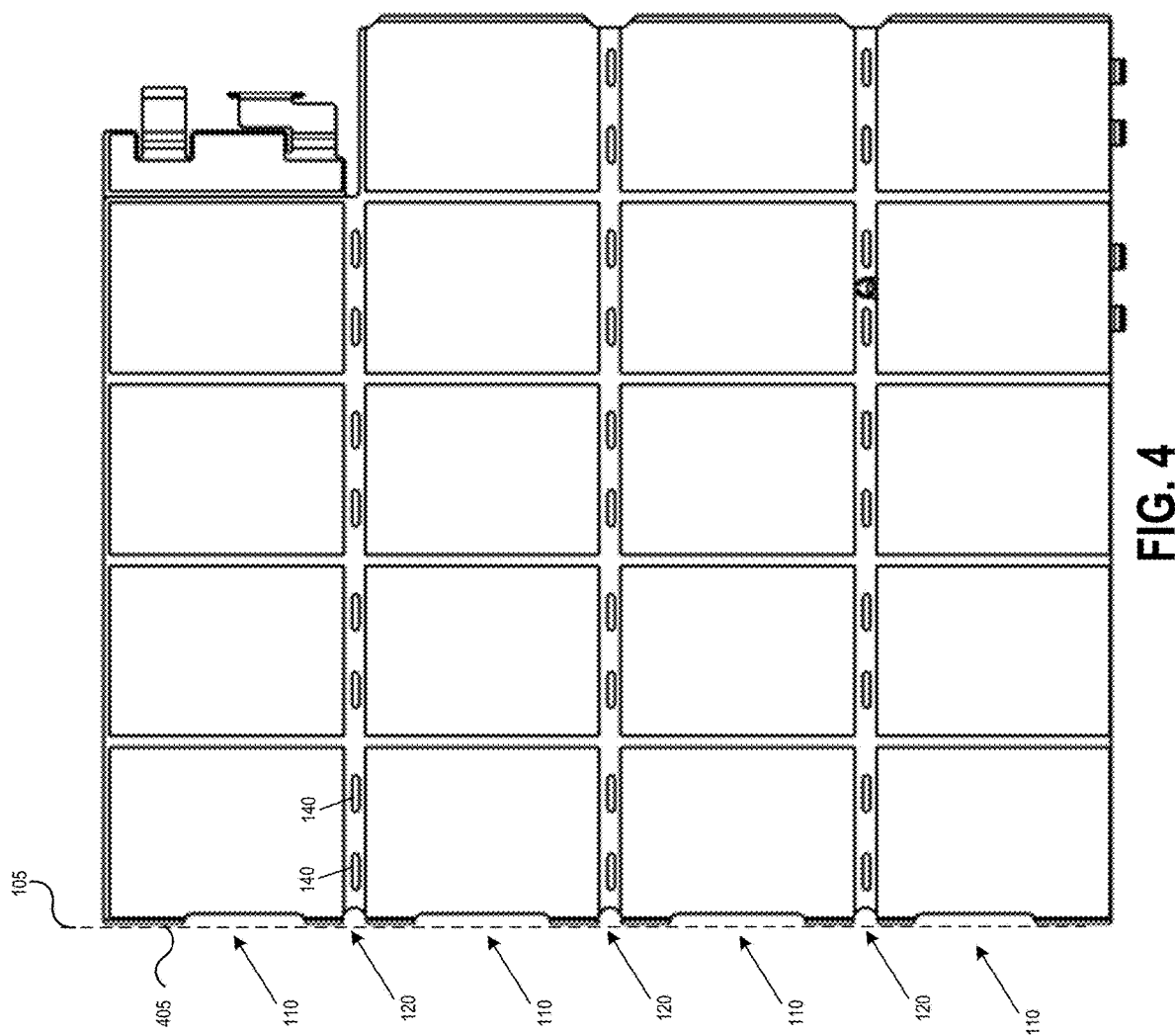
FIG. 4 shows a first view of the illustrative flexible printed circuit board folded along the bend line according to aspects of the present disclosure.

FIG. 4 shows a first view of the illustrative flexible printed circuit board 100 folded along the bend line 105 according to aspects of the present disclosure. For example, a 180-degree bend 405 may be formed along the bend line 105, such as when a left half of the flexible printed circuit board 100 is folded over a right half of the flexible printed circuit board 100 such that the battery modules are located on the exterior portion of the folded flexible printed circuit board 100 and the electrical connections for the battery modules are disposed on an interior portion of the folded flexible printed circuit board 100. A diameter of the bend 405 corresponds the length of the rectangular portion of the obround-shaped cut-out 120. In the illustrative example, the diameter of the bend 405 is about 2.25 mm.

Figure 5A:
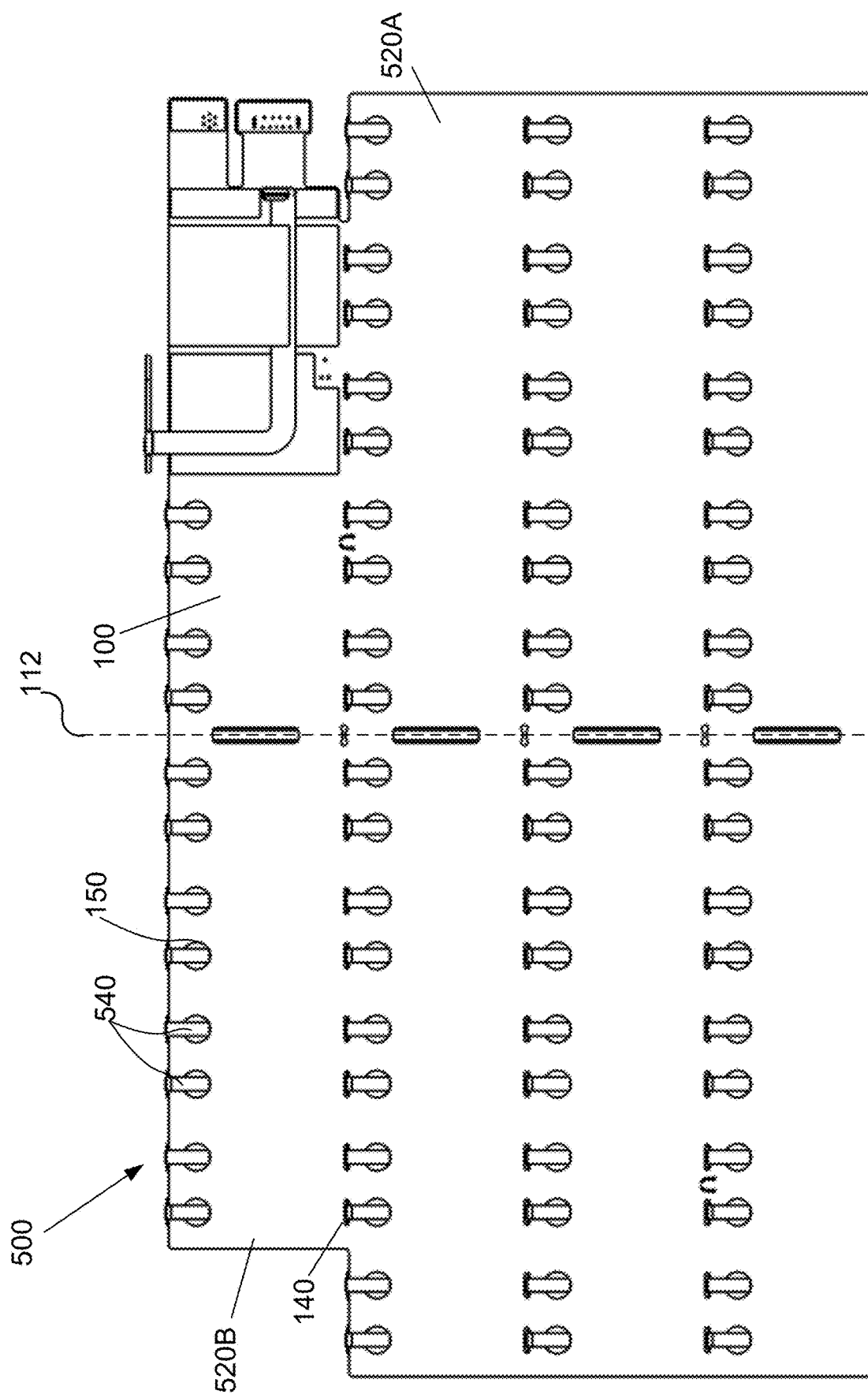
FIGS. 5A-5C show first views of flexible printed circuit board assemblies (PCBA) before folding along the bend line according to aspects of the present disclosure.
Figure 5B:
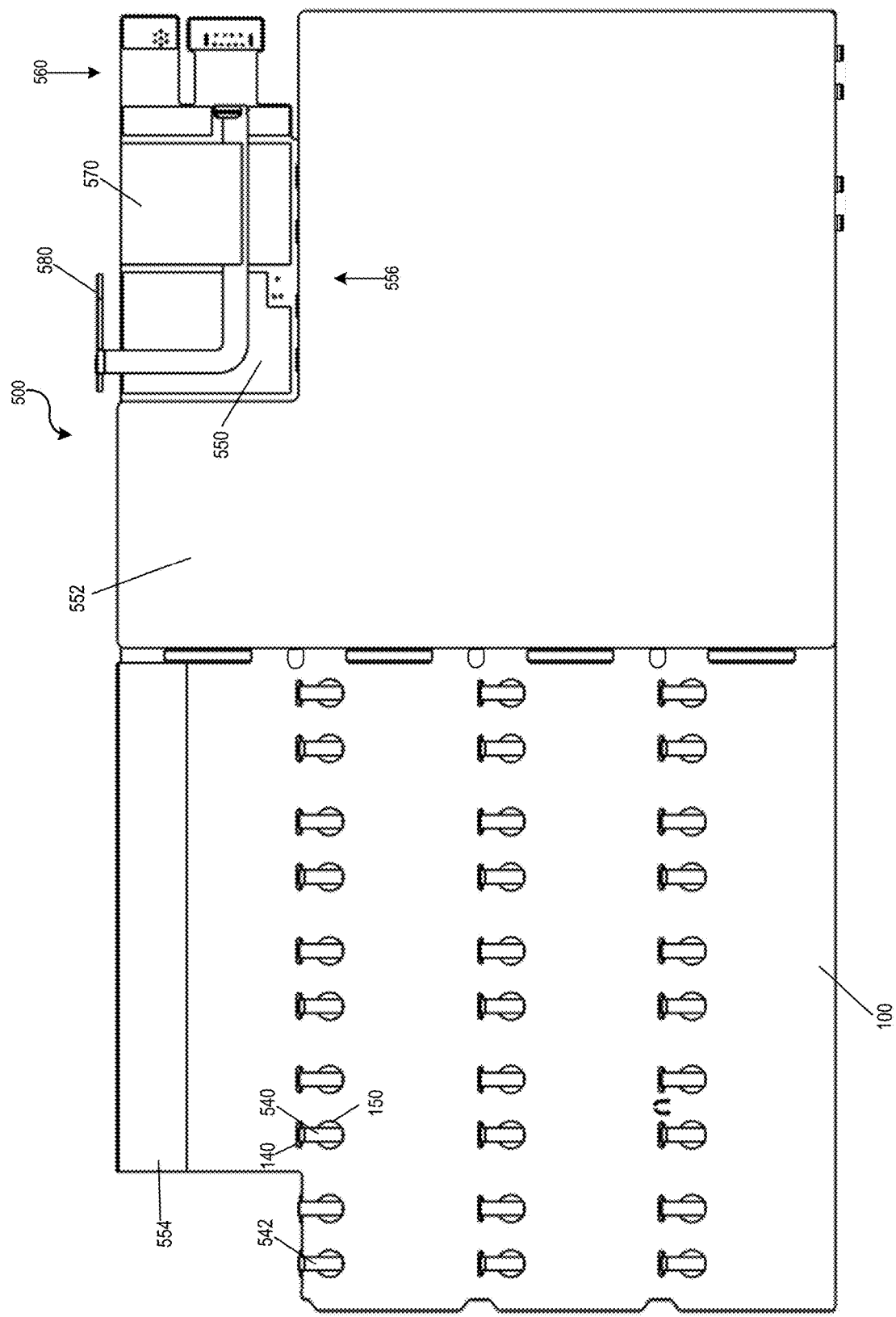
Figure 5C:
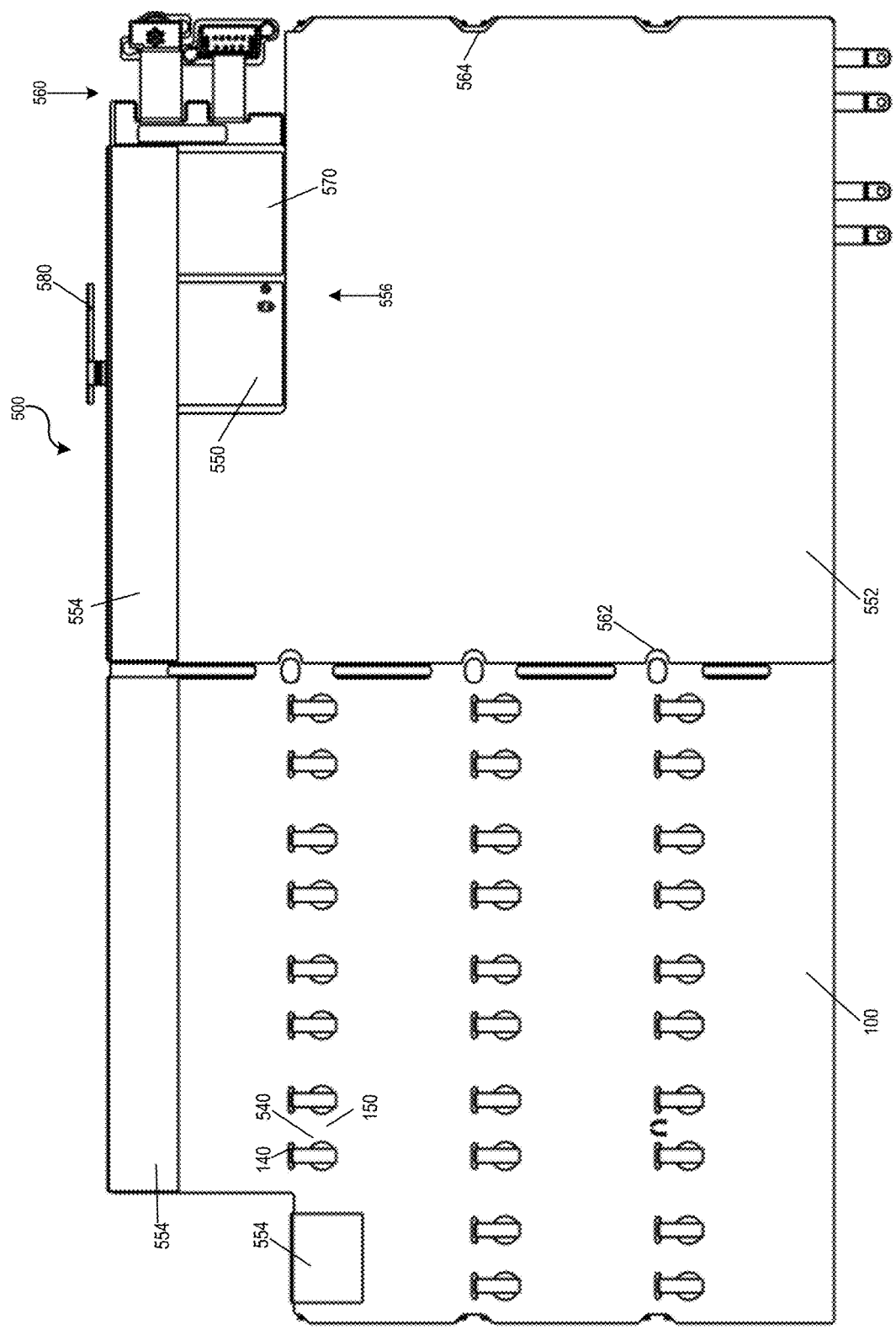

FIGS. 5A-5C show first views of a flexible printed circuit board assembly (PCBA) 500 before folding along the bend line 105 according to aspects of the present disclosure. As shown in FIG. 5A, electrically conductive cathode tabs and anode tabs 540 extend from corresponding battery cell modules through corresponding cut-outs 140 so that each conductive tab 540 may be soldered, welded or otherwise connected to a corresponding electrical connection pad 150 forming an electrical connection for each battery cell to the flexible PCBA 500. The electrical connection pads 150 may include an electroless nickel immersion gold (ENIG) surface coating, a lead-free immersion silver surface coating, or other coating that improves electrical connection durability and conductivity between the electrically conductive connection tabs and the electrical connection pads. The connection pad 150, and/or its surface coating, may allow for individual joining to facilitate connection of aluminum, nickel, or copper battery tabs 540. The electrically conductive connection tabs 540 may be connected to corresponding connection pads 150 using spot welding, ultrasonic welding, laser welding, and/or other welding or connection technique to reduce an amount of heat applied to the surface during the attachment process, an amount of material needed to form the joint while also increasing quality and/or a rate of production compared to typical soldering.

Figure 8:
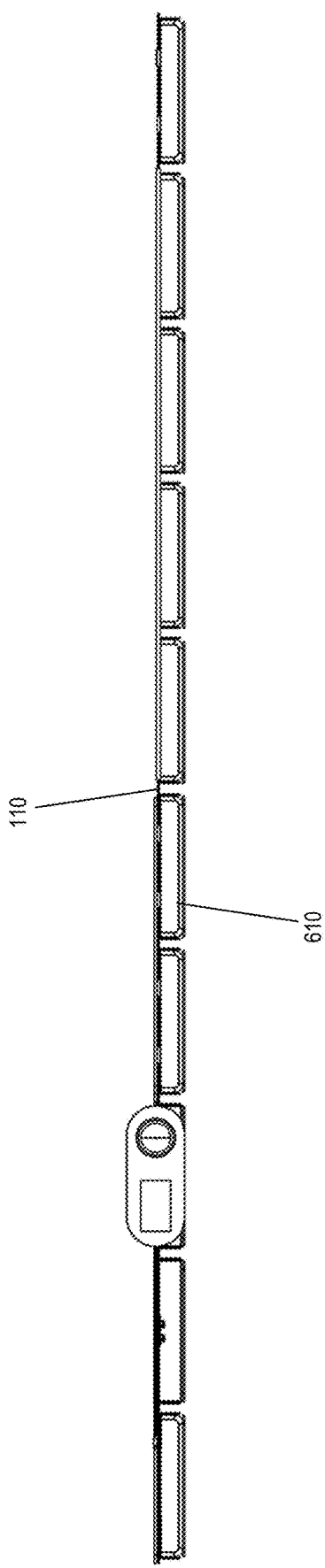
FIG. 8 shows a side view of the flexible PCBA before folding along the bend line according to aspects of the disclosure.

Because of the compact nature of the CWB and the folded configuration of the flexible PCBA 500, the electrical connection between the connection pads 150 and the battery connection tabs 540 may be minimized with respect to the height of the overall connection relative to the inward facing surfaces 520A, 520B. For instance, by using a welding technique that applies localized heat over a smaller amount of time compared to traditional soldering, the amount of material, and heat, needed to form a solid connection may be reduced. This means that the outward facing surface of the connection tab 540 may be have little to no additional material on it after being secured to the pad 150. Further, by minimizing applied heat during the connection process, a probability that the folded flexible PCBA 500, the battery cell(s), or other component near the connection site may be damaged is similarly reduced. In some cases, the joint may be formed using only by joining the material of the pad 150 and the material of the connection tab 540 without the addition of solder, weld filler, or any additional material. By minimizing the amount of material in the joint, the height, H1, of the connection may be controlled to reduce the overall thickness of the folded flexible PCBA 500. As shown in FIG. 8, the height, H1, may be defined as the distance between an outward facing surface of each connection tab 540 and the rear or inward facing surface 520A or 520B of the flexible PCBA 500. For example, the height, H1, of the joint may be approximately 1.5 times the thickness of the connection tab 540 or may be within a range of 1.2 to 3 times the thickness of the connection tab 540.

As can be seen in FIGS. 5B and 5C, cathode tabs and anode tabs (e.g., tab 540, tab 542, etc.) extend from corresponding battery cell modules through a cut-out 140 so that each tab 540 may be soldered, welded or otherwise connected to the electrical connection pad 150 forming an electrical connection for each battery cell. In some cases, for battery cells located near an edge of the flexible PCBA 500, the battery tabs (e.g., tab 542) may be folded over an edge of the flexible PCB 100 to be physically and electrically connected to the electrical circuitry of the flexible PCBA 500. To protect against short circuits and/or to provide additional protection and/or structural integrity for the CWB, while maintaining flexibility of the overall assembly, an insulating material 552, 554 (e.g., a foam material, a polymeric material, etc.) may be placed over a first half of the flexible PCBA 500 before folding. The insulating material 552 may include an insulation cut-out 556 section, where edges of the insulation cut-out 556 may be adjacent to a first electrical circuitry module 550, a second electrical circuitry module 570, a connector section 560, and/or an output module 580 (e.g., an OLED display, and LED display, and the like). In some cases, the insulating material 552 may include one or more cutouts that may align with a cutout of the flexible PCB 100, such as cut-out 562, and cut-out 564, as shown in FIG. 5C. In some regions of the flexible PCBA 500, each connection tab 540 may extend through a cutout 140 of the flexible PCB 100 to attach to its corresponding connection pad 150, while in other regions connection tabs 540 may extend from its respective battery cell and wrap around an upper edge of the PCB 100 before attaching to its corresponding connection pad 540.

Figure 6:
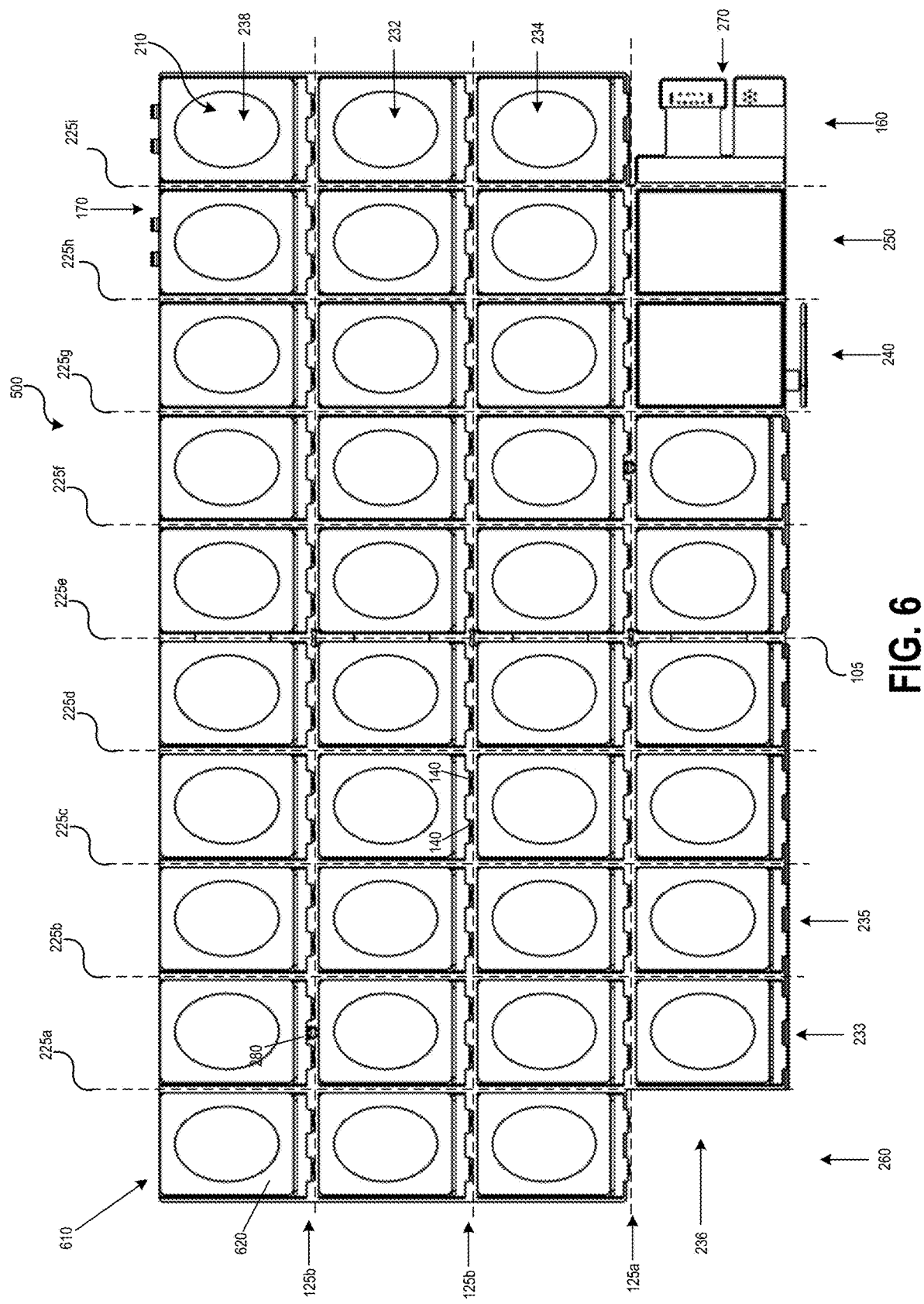
FIG. 6 shows a second view of the flexible PCBA before folding along the bend line according to aspects of the present disclosure.

FIG. 6 shows a second view of the flexible printed circuit board assembly 500 before folding along the bend line 105 according to aspects of the present disclosure. Here an array of battery cells 610 may be physically and electrically attached to the flexible PCBA 500. For example, each battery cell module 620 of the battery cell array 610 may be physically attached to a first side of the flexible PCBA 500. Electrical connections of each battery cell module 620 may be passed through a cut-out (e.g., the cut-out 140 to allow for an electrical and physical connection via a corresponding pad 150 on an opposite side of the flexible PCBA. Each battery cell module 620 of the array of battery cells may be connected to an electrical circuit of the flexible PCBA comprising a plurality of conductive paths, where at least a portion of the plurality of conductive paths provide redundant pathways for one of a conductive path electrically connecting the plurality of cathode tabs of the battery cell array 610 or a conductive path electrically connecting the plurality of anode tabs of the battery cell array 610. Each battery cell of the battery cell array 610 may be coupled together to provide electrical power to a desired electrical load that may be removable connected to the CWB. A positive terminal or tab of each battery cell may be coupled to a positive trace pad of a positive trace bus and a negative terminal or tab of each battery cell may be coupled to a negative trace pad of a negative trace bus such that the plurality of battery cell modules of the battery cell array 610 may be electrically coupled in parallel with one another. In some cases, the positive trace bus and the negative trace bus may each include a plurality of electrical pathways. For example, the positive trace bus and the negative trace bus may each be formed as a conductive mesh. In some cases, the conductive mesh may form a plurality of alternative conductive paths connecting to the plurality of positive trace pads and negative trace pads. Should a portion of the alternate conductive paths of the conductive mesh be damaged, for example by a destructive penetration to the CWB, a tear, a fracture, or other such damage to the flexible PCB, other alternative conductive pathways of the conductive mesh may be capable of providing electrical current around the damaged area.

In some cases, one or more of the alternative conductive pathways may be connected to one of a positive battery cell tab, a negative battery cell tab, protection circuitry, data circuitry, clock circuitry and/or other circuitry associated with operation and/or monitoring of the CWB. Circuitry associated with the battery cell may include battery charging control circuitry, for example. Conductive pathways may carry electrical current and/or data signals between the battery cell and/or associated circuitry within an interior of a CWB housing and one or more contact component accessible on the outside of the CWB housing.

Figure 7:
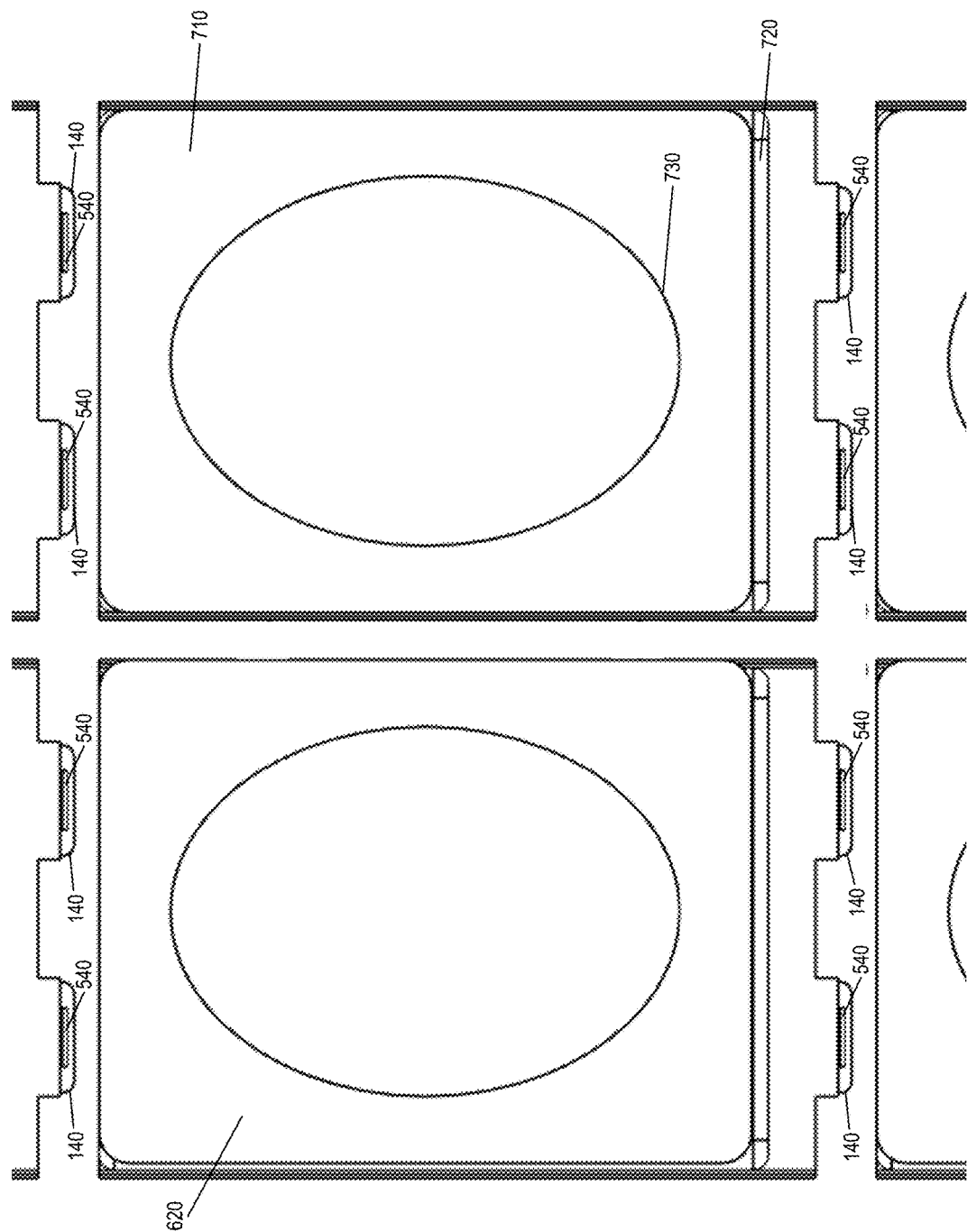
FIG. 7 shows a partial first view of the flexible printed circuit board assembly showing a partial arrangement of adjacent battery cell modules when attached in an array or matrix format on the flexible PCBA according to aspects of the present disclosure.

FIG. 7 shows a partial first view of the flexible printed circuit board assembly 500 showing a partial arrangement of adjacent battery cell modules (e.g., battery cell module 620) when attached in an array or matrix format on the flexible PCBA 500. Each battery cell module 620 may include an attenuating member 710 attached to a battery cell 720 such that when the battery cell module 620 is physically attached to the flexible PCBA 500, a first side of the battery cell 720 may be adhered or otherwise attached to the flexible PCBA 500 and the attenuating member 710 may be attached to an opposite side of the battery cell module 720.

As shown, the plurality of battery cell attenuating members 710 may be individually attached to the outward facing surface of each battery cell 720. Each battery cell attenuating member 710 may be positioned between the outward facing surface of the battery cell 720 so that a top surface of the attenuating member 710 faces an interior surface of the CWB, when assembled. In addition, each battery cell attenuating member 710 may also contact one of the interior surface of the CWB. In short, attenuating member 710 may be located between the battery cells 720 arranged on the flexible PCBA 500, and the battery cell attenuating members 710 may located between the battery cells 720 and the housing of the CWB. The attenuating members 710 may help to protect the battery cells 720 by absorbing the forces received by the CWB 10 from any impacts or collisions. The battery cell attenuating members 710 may be formed from a visco-elastic material that can attenuate shock and vibration. In some cases, the visco-elastic material may include other properties including intumescent properties or other fire blocking and/or suppression characteristics. The visco-elastic material may be formed from a polymeric material such as a polyurethane based material such as Poron®, Sorbothane®, or similar material. In some cases, the battery cell attenuating members 710 may be made of an electrically insulative material.

Each battery cell attenuating member 710 may have an opening 730 extending through the thickness of the attenuating member 710. Each opening 730 may create a cavity between the respective outward facing surface of the battery cell 720 and one of the interior surfaces of the housing of the CWB. As the battery cells 720 go through cycles of discharging and recharging, the chemical reaction inside the battery cells 720 may cause the battery cells 720 to swell or increase in volume. As the battery cells 720 swell, they may expand into the cavity created by the opening 730. In some cases, the battery cells 720 may encounter swelling of less than 4%. In some cases, the battery cells 720 may swell in a range between 4% and 10%. In some cases, the battery cells 720 may encounter swelling of about 15% or less. The thickness of the battery cell attenuating member 710 may be approximately 10 percent of the thickness of the battery cell 720, or may be within a range of 8 percent and 15 percent of the thickness of the battery cell 720. In some examples, the opening 730 may not extend through the entire thickness of the attenuating member 710 creating cavity within attenuating member 710. For example, the opening 730 may extend from the rear surface through at least 50 percent of the thickness, or through at least 75 percent of the thickness. In these cases, the depth of the cavity may be within a range of 4 percent and 15 percent of the thickness of the battery cell 130.

Figure 9:
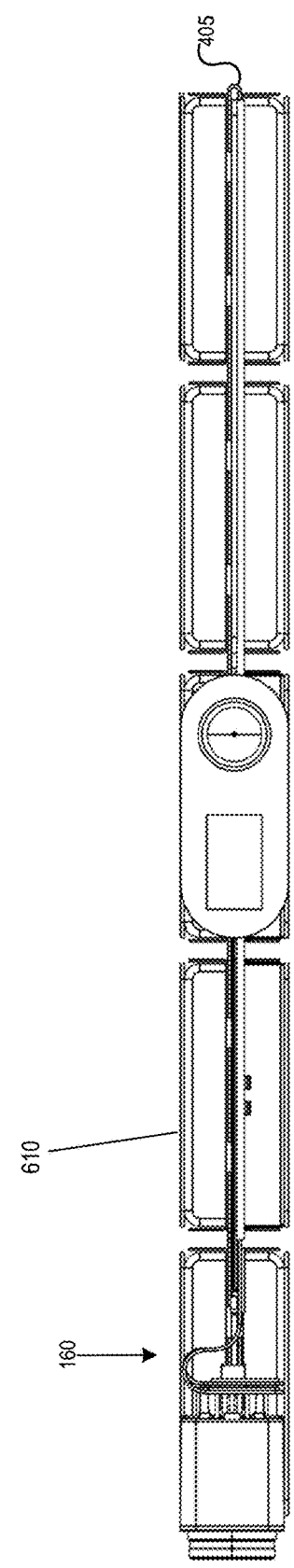
FIG. 9 shows a side view of the flexible PCBA after folding along the center line according to aspects of the disclosure.
Figure 10:
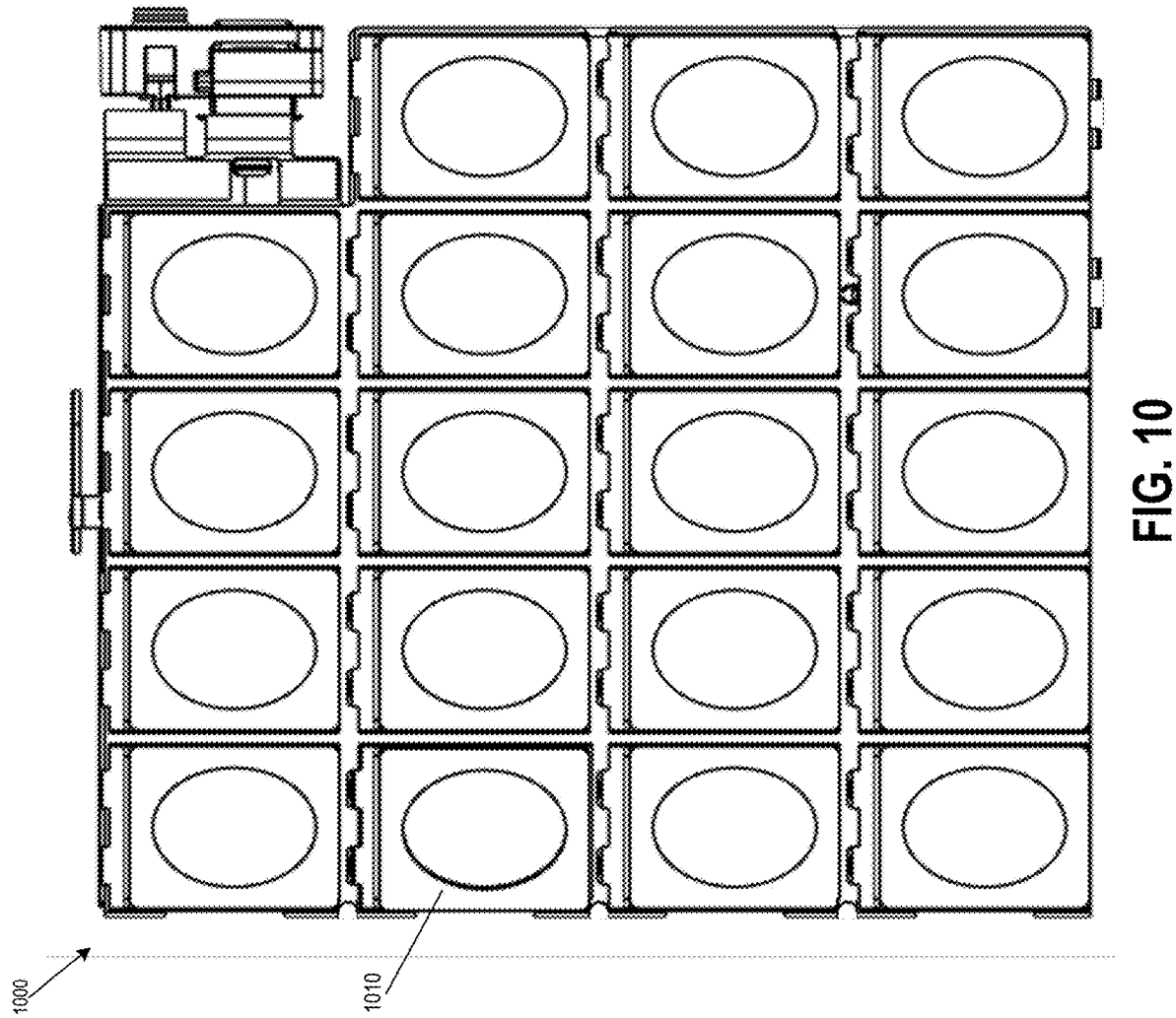
FIG. 10 shows a first view of the flexible printed circuit board assembly after folding along the bend line according to aspects of the disclosure.

FIG. 8 shows a side view of the flexible PCBA 500 before folding along the bend line according to aspects of the disclosure and FIG. 9 shows a side view of the flexible PCBA 500 after folding along the center line according to aspects of the disclosure. FIG. 10 shows a first view of the flexible printed circuit board assembly (PCBA) 1000 after folding along the bend line according to aspects of the disclosure. After folding the flexible PCBA 1000, a side of the folded flexible PCBA 500 is shown to have a battery cell array or matrix having 19 battery cell modules 1010 and an opening including a connector section. In this illustrative example, the battery cell array may be arranged as a 5×4 matrix of battery cells and an opening to accommodate the connector section. While the 5×4 matrix is shown, other arrangements and/or configurations of the battery cell matrix (e.g. a 5×5 matrix, a 4×4 matrix, a 4×3 matrix, a 3×2 matrix, a 4×1 matrix, a 3×3 matrix, etc.) may be contemplated within scope of this disclosure. Once the flexible PCBA 500 is folded, battery cell modules affixed to either half of the folded flexible PCBA 500 are positioned opposite to a corresponding battery cell module or a circuitry module.

Figure 11:
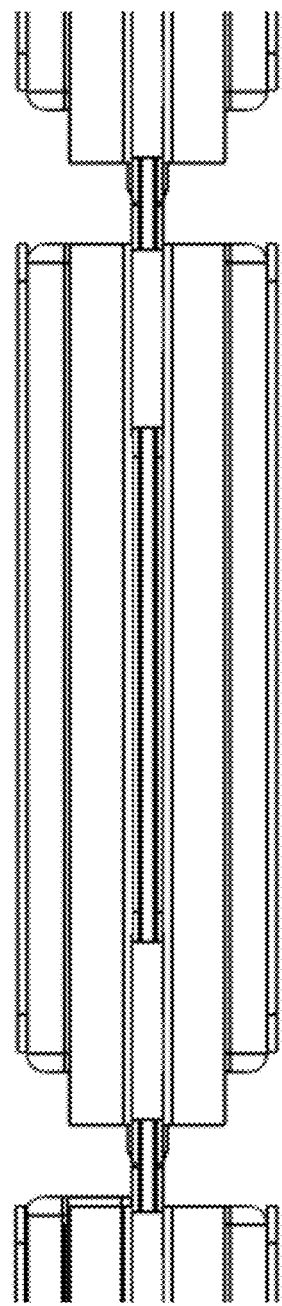
FIG. 11 shows a partial side view of the flexible PCBA after folding along the bend line.
Figure 12:
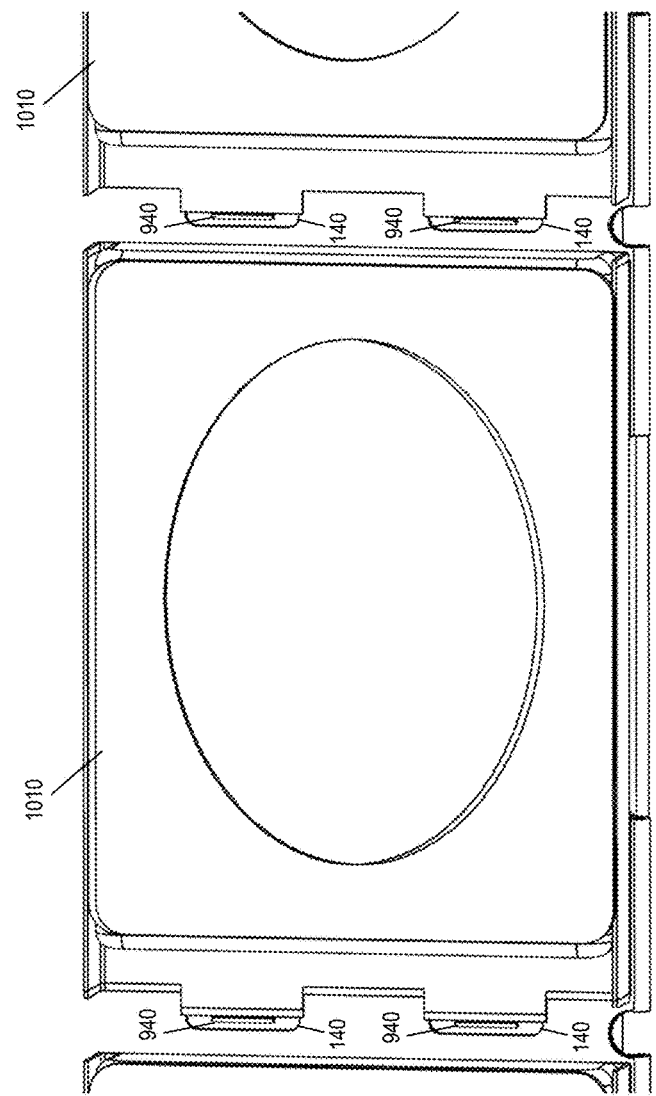
FIG. 12 shows a partial first view of the flexible PCBA after folding along the bend line according to aspects of the disclosure.
Figure 14B:
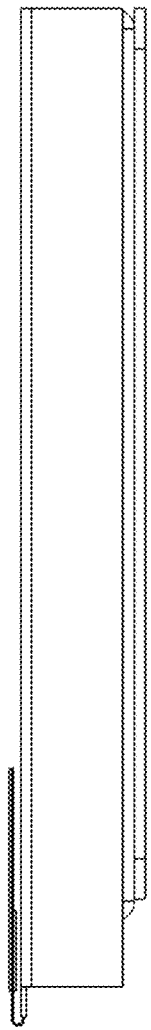
FIGS. 14A-14E show illustrative views of a battery cell module comprising a battery cell and a battery cell attenuating member according to aspects of the disclosure.
Figure 14C:
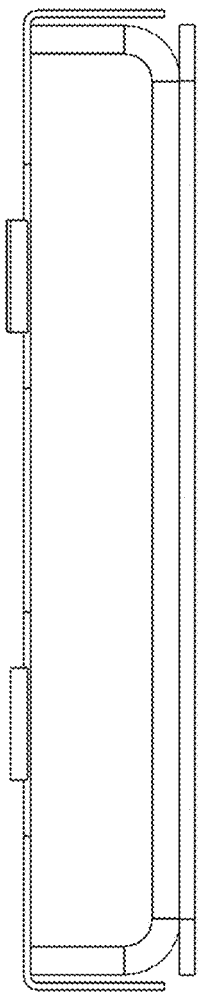
Figure 14D:
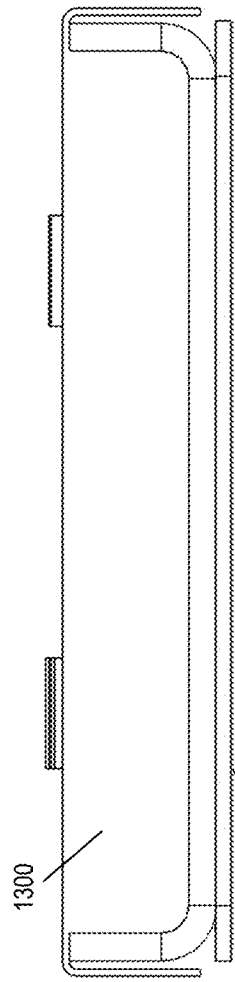
Figure 14A:
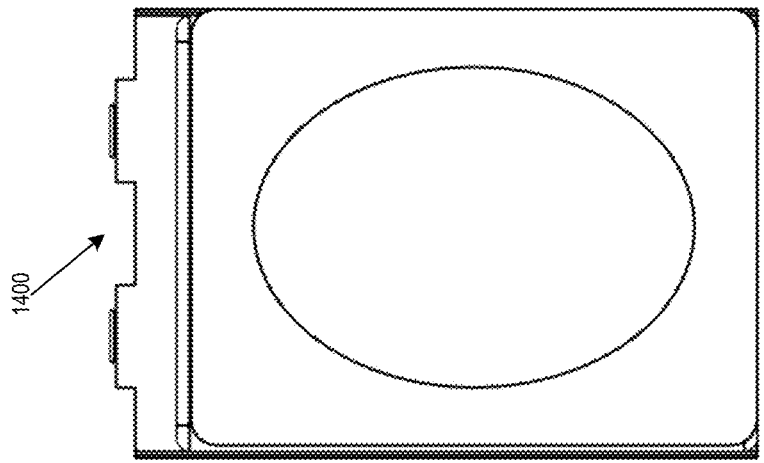
Figure 14E:
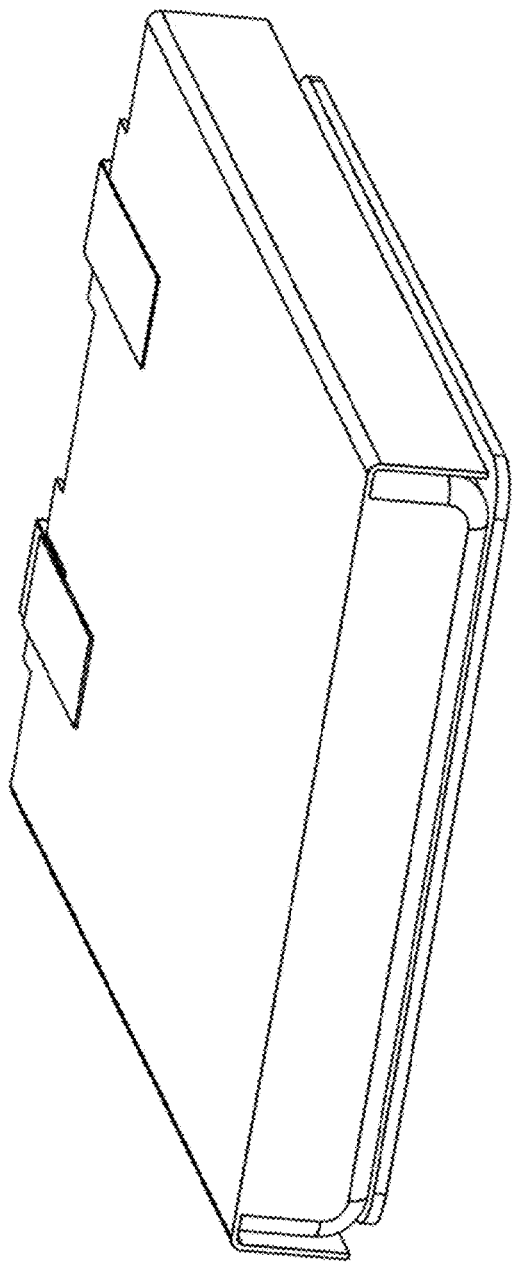

FIG. 11 shows a partial side view of the flexible PCBA 900 after folding along the bend line and FIG. 12 shows a partial first view of the flexible PCBA 900 after folding along the bend line according to aspects of the disclosure.

FIGS. 13A-13D show different views of an illustrative battery cell 1300 (e.g., a pouch cell packaged polymer lithium-ion battery), which may be incorporated into a battery cell module as discussed above. In some cases, a chemical system of battery cell 1300 may include one of a lithium cobalt oxide, nickel cobalt manganese, nickel cobalt aluminum, or other such chemical systems. In an illustrative example, the dimensions of the battery cell 130 may be about 43 mm in length, about 34 mm in width, and about 6 mm in height, but battery cells of other dimensions may be used within the scope of this disclosure. Additionally, the battery cell 130 may weigh between 22.5 grams and 24.5 grams (e.g., 23.5 grams) and may have an energy storage capacity between 1400 mAh and 1500 mAh (e.g., about 1,435 mAh). The size, weight, and energy storage capacity of each battery cell of the CWB may be designed such that the overall size, weight, and energy storage capacity of the flexible PCBA for the CWB meets an energy storage capacity specification, weight specification, and/or size specification for a CWB. For example, the height, width, and length of each battery cell may be designed, at least in part, to meet a flexibility requirement of the CWB, such that an assembled CWB may conform, under load, to a 7-inch radius curved surface, such that an edge of the CWB may be capable of deflecting, in each direction, at least a specified distance (e.g., 1 inch) from a centerline of the CWB. Additionally, the size, and/or shape of the battery cells may allow for a specified number of battery cells (e.g., about 36 battery cells) and/or configuration of the battery grid such that the energy capacity for the CWB may be at least 148 Watt-hours (Wh) (e.g., about 150 Wh, about 170 Wh, about 190 Wh, about 200 Wh, etc.) and/or where the maximum weight of the CWB is less than a specified maximum weight (e.g., about 2.6 pounds). In some cases, a configuration of the battery cells of the CWB may allow the CWB to output a voltage between about 10 and about 20 V, (e.g., about 14.8V) within a specified size and/or shape of the CWB. For example, an illustrative CWB may have an overall dimensions of between about 8.5 in. and 9.0 inches (e.g., about 8.7 in.)×between about 7.5 in and 8 in. (e.g., about 7.66 in.)× between about 0.5 in. and 0.8 in. (e.g., 0.70 in.).

FIGS. 13A-13D show different views of an illustrative battery cell 1300 (e.g., a pouch cell packaged polymer lithium-ion battery), which may be incorporated into a battery cell module 1010 as discussed above. In some cases, a chemical system of battery cell 1300 may include one of a lithium cobalt oxide, nickel cobalt manganese, nickel cobalt aluminum, or other such chemical systems. In an illustrative example, the dimensions of the battery cell 1300 may be in a range between about 42 mm to about 44 mm (e.g., 43 mm) in length, a range between about 33 mm and 35 mm (e.g., about 34 mm) in width, and in a range between about 5 mm and 7 mm (e.g., about 6 mm) in height, but battery cells of other dimensions may be used within the scope of this disclosure. FIG. 13D shows an illustrative side view of the battery cell 1300. While lithium-ion battery cells in a pouch-cell format are discussed, other battery formats or chemistries may be used, such as prismatic battery cells, can-type battery cells, and the like.

In FIGS. 13A-13D, the battery cell tabs 540 may include a cathode tab 1302 and an anode tab 1304. The cathode tab 1302 and anode tab 1304 are shown in a bent configuration illustrative of the physical configuration of the cathode tab 1302 and anode tab 1304 for when the battery cell 1300 is physically attached to the flexible PCB 100, where the cathode tab 1302 and the anode tab 1304 are placed through corresponding cutouts 140 so that the cathode tab 1302 and the anode tab 1304 each may be electrically connected (e.g., soldered, laser welded, ultrasonic welded, etc.) to a corresponding pad 150. In some cases, the cathode tab 1302 may be made of a first material (e.g., copper) and may be clad in a second material (e.g., aluminum). In some cases, the cathode tab may be made of a single material (e.g., aluminum, copper, etc.). This cladding arrangement may cause a thickness and/or height of the cathode tab 1302 relative to its respective inward facing surface of the PCB 100 to be greater than a thickness or height of the anode tab 1304. The anode tab and the cathode tab may be made of or include a similar electrically conductive metal, such as copper, aluminum, nickel and the like. In the illustrative example of FIG. 13A, opposing edges of the cathode tab 1302 and the anode tab 1304 may be positioned approximately 12 mm apart or within a range of 10 mm and 15 mm apart. Further, the cathode tab 1302 and the anode tab 1304 may have a similar length (e.g., about 12.4 mm) and/or a similar width (e.g., about 4 mm), however, one or more dimensions of the cathode tab 1302 or anode tab 1304 may differ from the other within the scope of this disclosure. FIG. 13A shows a front view of the battery cell 1300. The terms "top" 1342 and "bottom" 1344 are terms that refer to specific sides of the battery cell 1300, where the top 1342 and bottom 1344 adjacent the front 1346 and rear sides 1348 of the battery cell 1300 is affixed to the flexible PCB 100, the outward facing surface 1332 may be on a front 1346 of the battery cell 1300 is opposite the bottom 1344 side and faces towards an interior surface of a housing of the CWB. FIG. 13D shows a top view of the battery cell 1300 that illustrates a thickness of the battery cell 1300. FIG. 13B shows an illustrative side view of the battery cell 1300. While lithium-ion battery cells in a pouch-cell format are discussed, other battery formats or chemistries may be used, such as prismatic battery cells, can-type battery cells, and the like.

In some cases, connection locations for each battery cell 1300 may be marked on the flexible PCB 100 Additionally or alternatively, battery cell connection locations may include a rigidizing material, or may be otherwise reinforced such as via attachment of a battery cell module. Each battery cell connection location may be associated with a pair of cutouts 140 for the anode and cathode connections, as discussed above. Here, a battery cell module 1300 may be physically attached to the substrate of the flexible PCB 100, such as by use of an adhesive material (e.g., glue, tape, etc.).

Electrically conductive cathode and anode connection tabs 1302, 1304 may be inserted through a corresponding cutout 140 so that the connection tabs 540 may be welded, or otherwise connected to the connection pad 150 on the rear side of the flexible PCB 100 to create an electrical connection between the battery cell 1300 and the flexible PCB 100. The cathode and anode connection tabs 1302, 1304 may be different materials. For instance, the electrically conductive cathode and anode connection tabs 1302, 1304 may comprise one or more of aluminum, copper, nickel, or other materials.

FIGS. 14A-14E show illustrative views of a battery cell module 1400 comprising a battery cell (e.g., the battery cell 1300) and a battery cell attenuating member 710 (e.g. an attenuating member made of a resilient, shock absorbing material) according to aspects of this disclosure. In the illustrative example, the battery cell attenuating member 710 may be affixed to a top surface (e.g., top 1320) of the battery cell 1300 to form the battery cell module 1400. In some cases, the battery cell attenuating member 710 may be affixed with glue, epoxy, tape or other adhesive substance. In some cases, as can be shown between the views of FIGS. 14C and 14D, the attenuating member may be aligned with a center line of the battery cell 1300. For example, one or more center lines of the attenuating member 710 may be aligned with one or more corresponding center lines of the battery cell 1300. In some cases, the attenuating member may be slightly offset or from a center line of the battery cell 1300. For example, a first edge of the attenuating member 1310 may be aligned with a corresponding edge of the battery cell pouch, while a second opposite edge of the battery cell attenuating member 710 may be aligned with the foil external to the opposite edge of the battery cell pouch.

FIGS. 15A and 15B show partial illustrative views of at least one battery cell module 1400 attachments to the flexible PCBA 500 according to aspects of this disclosure. For example, battery cell tabs (the cathode tab 1302 and the anode tab 1304) are shown in FIG. 15A as being passed through the cut-out 140 and/or bent around an edge of the flexible PCB 100 and electrically and physically attached an associated bonding pad 150. FIG. 15B shows an edge view of a physical arrangement for a battery cell module 1400 attachment to the flexible PCB 100.

Figure 15D:
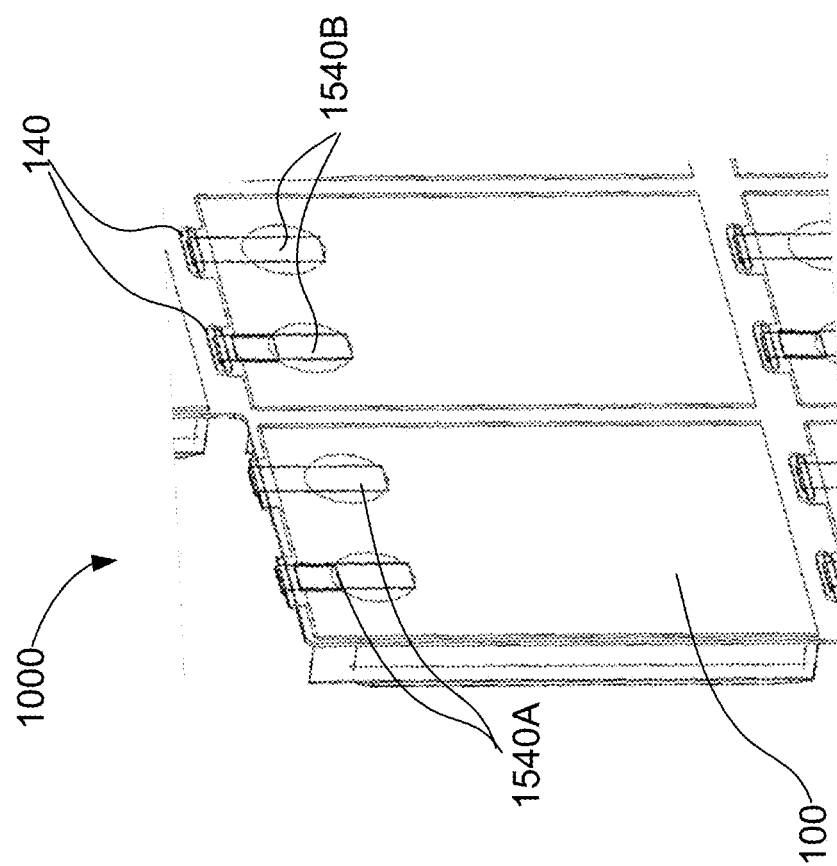
Figure 15C:
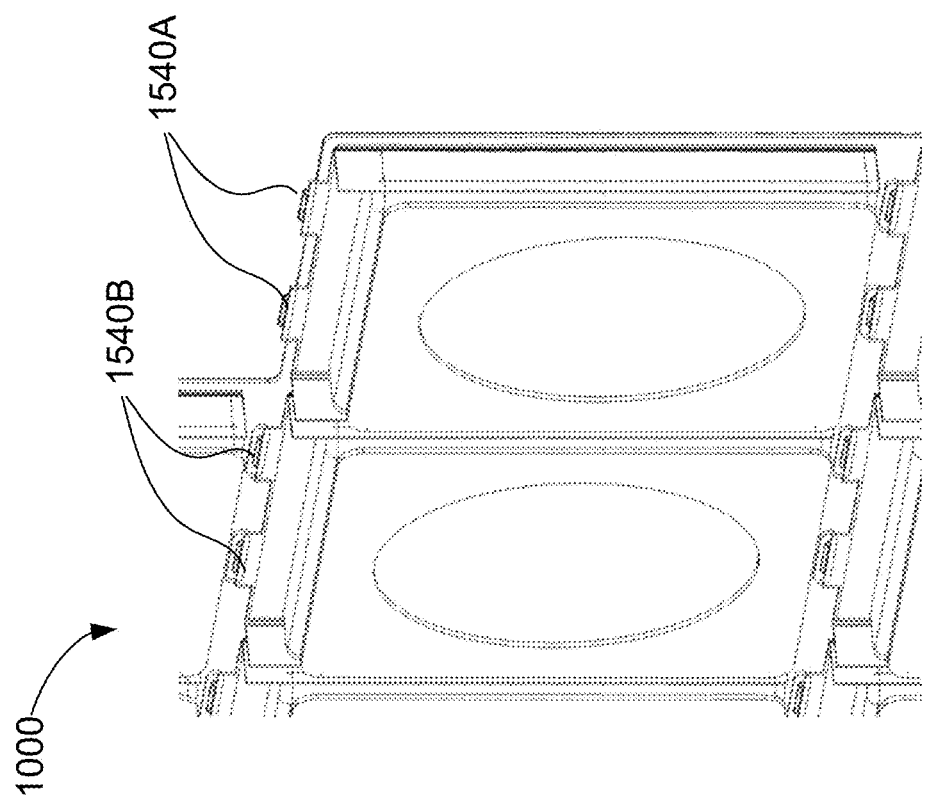
Figure 15E:
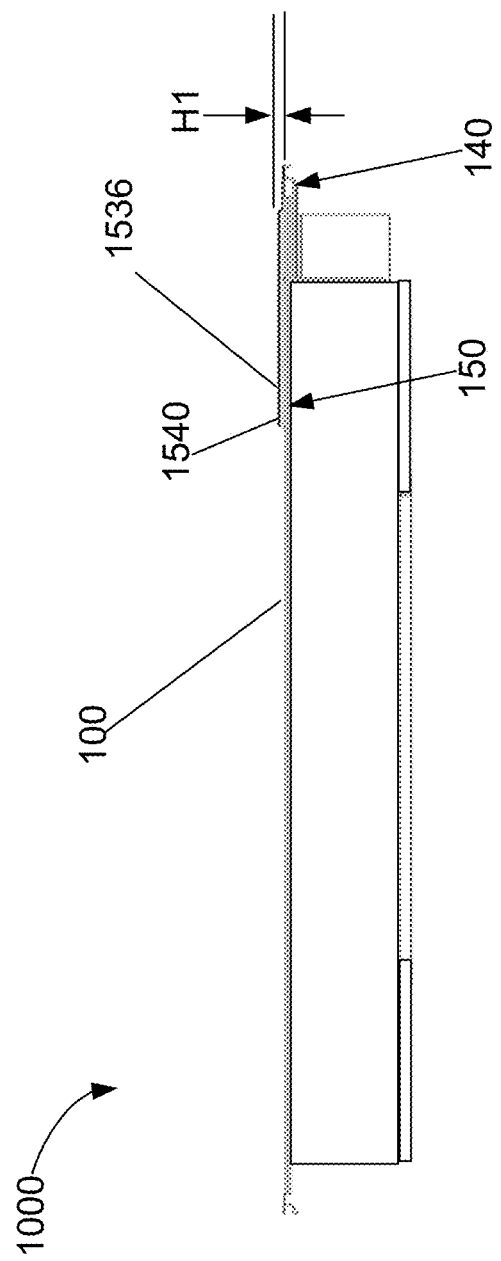

Because of the compact nature of the CWB and the folded PCBA 1000, the electrical connection between the connection pads 150 and the battery connection tabs (e.g., tabs 1540A, tabs 1540B) may be minimized with respect to the height of the overall connection relative to the inward facing surfaces 520A, 520B, as shown in FIGS. 15C and 15D. For instance, by using a welding technique that applies localized heat over a smaller amount of time compared to traditional soldering, the amount of material, and heat, needed to form a solid connection may be reduced. This means that the outward facing surface of the connection tab 1540 may be have little to no additional material on it after being secured to the pad 150. Further, by minimizing applied heat during the connection process, a probability that the folded PCBA 1000, the battery cell 1300, or other component near the connection site may be damaged is similarly reduced. In some cases, the joint may be formed using only by joining the material of the pad 150 and the material of the connection tab 540 without the addition of solder, weld filler, or any additional material. By minimizing the amount of material in the joint, the height, H1 shown in FIG. 15E, of the connection may be controlled to reduce the overall thickness of the folded PCBA 1000. As shown in FIG. 15E, the height, H1, may be defined as the distance between an outward facing surface 1536 of each connection tab 1540A, 1540B and the rear or inward facing surface 520A or 520B of the flexible PCB 100. In some cases, the joint formed by joining the material of the pad 150 with the material of the connection tab 540 may be made via a process capable of minimizing the height of the joint, such that the joint thickness is much less than the thickness of the connection tab 540. For example, the height, H1, of the joint may be made via a process (e.g., laser welding) such that at least a portion of the connection tab 540 and/or a portion of the pad 150 may be joined together with a joint height that is less than the height of a joint of similar materials made through use of a different process (e.g., soldering). For example, the height H1 may be approximately 30% of the thickness of the connection tab 540 or may be within a range of 10% to 70% of the thickness of the connection tab 540.

In some regions of the PCBA 1000, such as for battery cell 1300B, each connection tab 540 may extend through a cutout 140 of the flexible PCB 100 to attach to its corresponding connection pad 150, while in other regions, connection tabs 540 may extend from respective battery cell 1300 and wrap around an upper edge of the flexible PCB 100 before attaching to its corresponding connection pad 150. For example, as shown in FIGS. 15C and 15D, battery cell 1300A that may be positioned near an edge of the flexible PCB 100 (e.g., a battery cell may not have an adjacent battery cell positioned adjacent to it on the side of the battery cell that has the connecting tabs) may have connection tabs 1540A that extend away from the battery cell and wrap around an upper edge of the flexible PCB 100 before extending along an opposite side of the flexible PCB 100 before attaching to connection pad 150.

Figure 16:
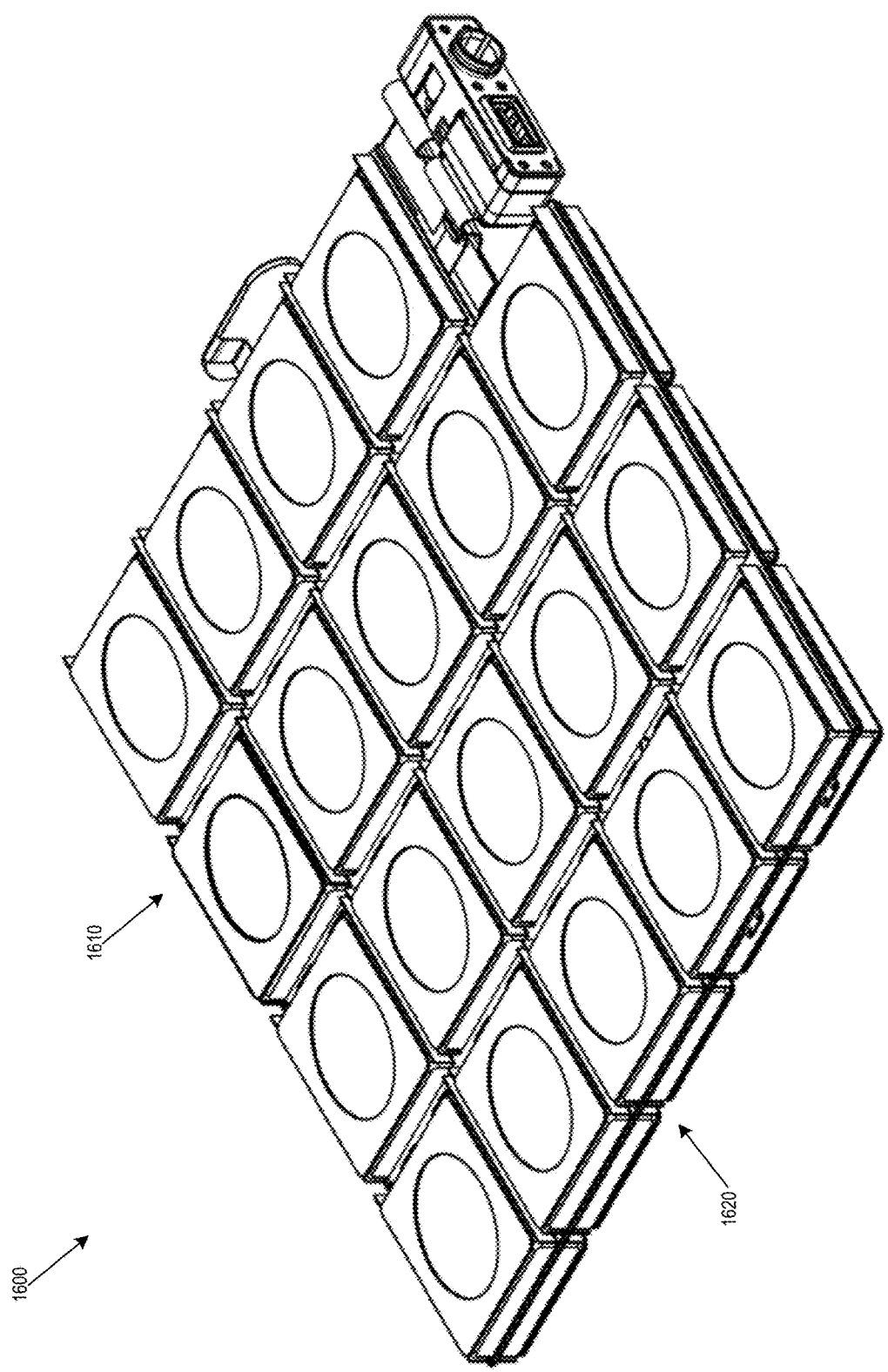
FIGS. 16 and 17 show different perspective views of a battery cell matrix or grid associated with a flexible PCBA according to aspects of the present disclosure.
Figure 17:
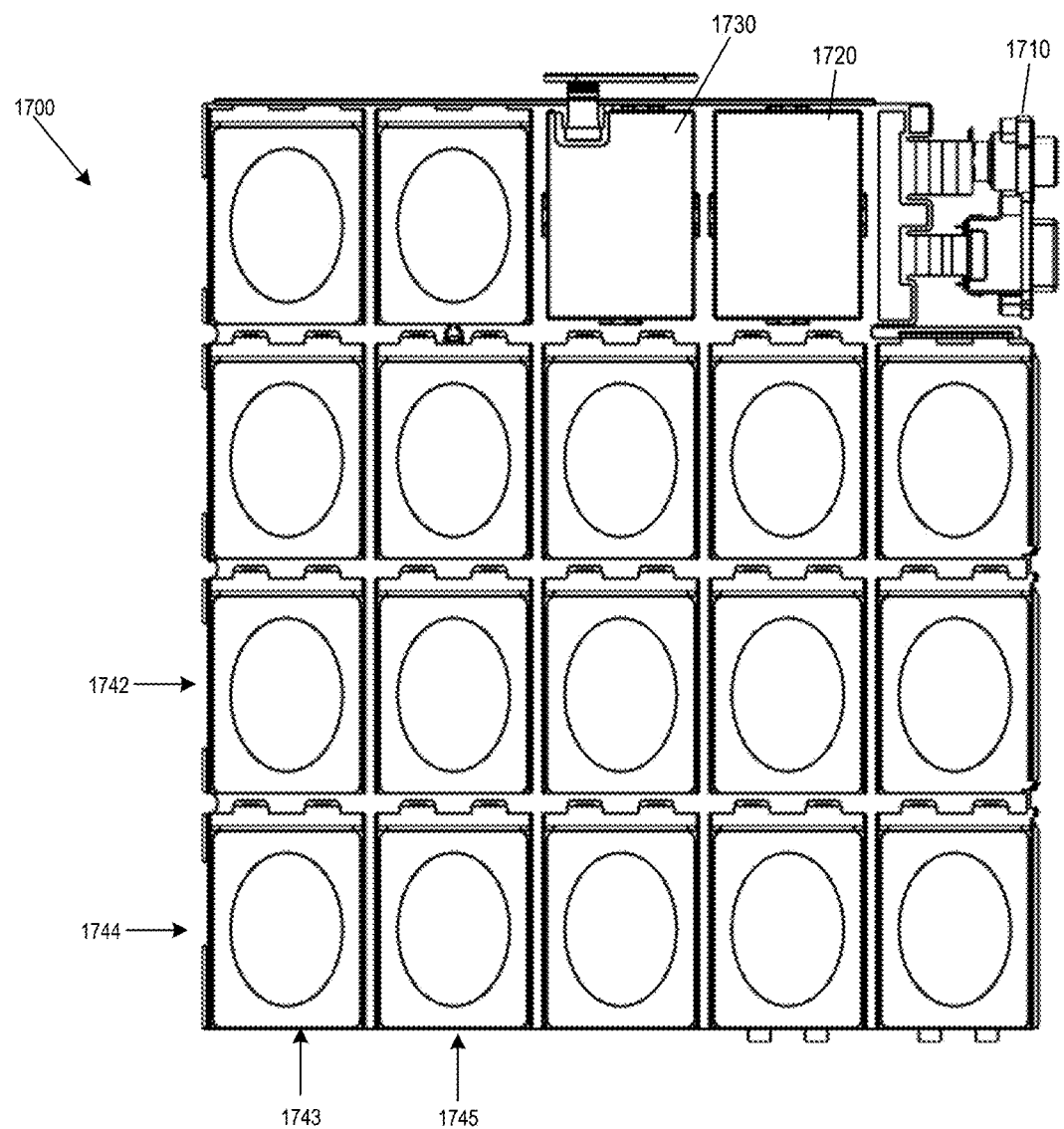

FIGS. 16 and 17 show different perspective views of a battery cell matrix or grid associated with a flexible PCBA according to aspects of this disclosure. For example, the flexible PCBA assembly 1600 may include a number of battery cells arranged in a matrix configuration 1610, such as a 5×4 matrix, with one position having an opening for a connector interface. In some cases, the flexible PCBA 1600 may include a 3-dimensional matrix configuration 1620, such as a 5×4×2 matrix configuration, where some matrix positions may not include battery cell modules, but may include circuitry modules, connection modules, open spaces and/or the like. FIG. 17 shows a view of an opposite side of the flexible PCBA 1600 of FIG. 16, where positions of the matrix may be filled battery cell modules, a connector module 1710, and/or one or more circuitry modules 1720, 1730. Considering the view of FIG. 17, a 3-dimensional (e.g., a 5×4×2) battery cell matrix configuration 1620 may include the 5×4 matrix configuration 1610 of FIG. 16 and the 5×4 matrix configuration 1700 of FIG. 17. In some cases, adjacent columns of the battery cell matrix configuration 1700 (e.g., column 1743, column 1745) may have a spacing between about 4.5 mm to about 5.5 mm (e.g., about 5 mm) and adjacent rows of the battery cell matrix 1700 (e.g., row 1742, row 174) may have a spacing between about 6.5 mm to about 7.5 mm (e.g., about 7 mm). The spacing between adjacent rows and/or adjacent columns may be determined, at least in part, based on a size and/or shape of a battery module to allow an assembled CWB to meet power, flexing, and/or sizing requirements set forth in a specification and/or standard, such as to meet the requirements of MIL-PRF-32383/4A.

In some cases, a battery cell matrix may include only battery cells, such as a 3×3 battery cell matrix, a 4×4 battery cell matrix, a 5×4 battery cell matrix, or other single-sided or double-sided matrix configuration within a flexible and sealed housing, where control and monitoring circuitry may be externally connected (e.g., via a flexible connector, a cable, and/or the like) to the battery cell matrix, either within or external to a CWB housing. The specific matrix configurations and spacings are given for illustrative purposes and other matrix configurations and spacings may be contemplated within the scope of this disclosure.

Figure 18A:
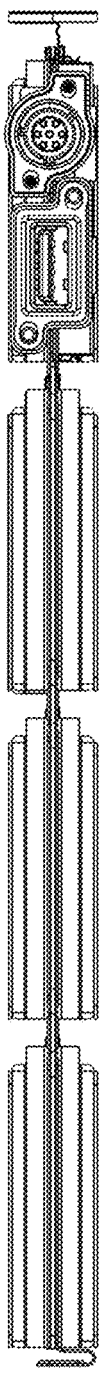
FIGS. 18A-18D show different side views of the flexible PCBA from a perspective of each of four different edges according to aspects of this disclosure.
Figure 18B:
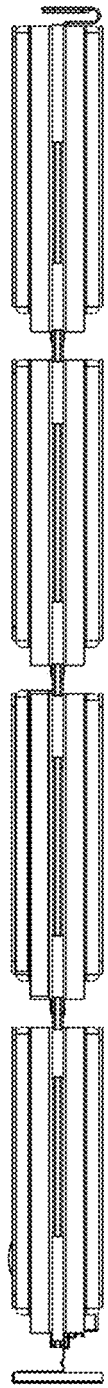
Figure 18C:
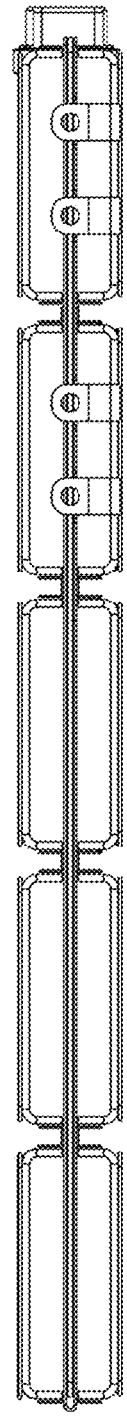
Figure 18D:
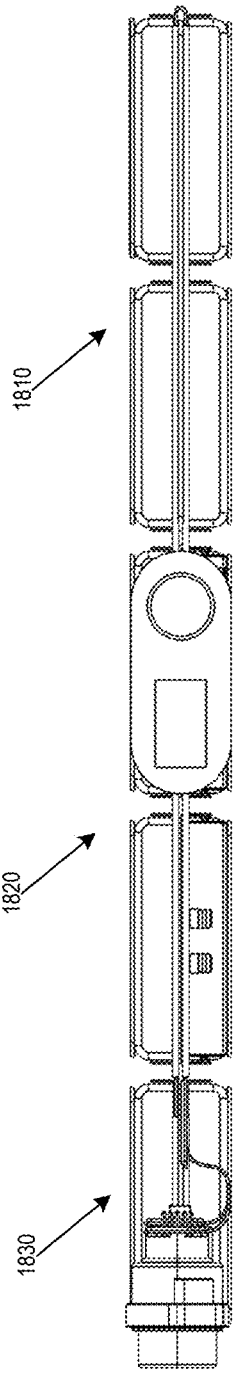
Figure 19:
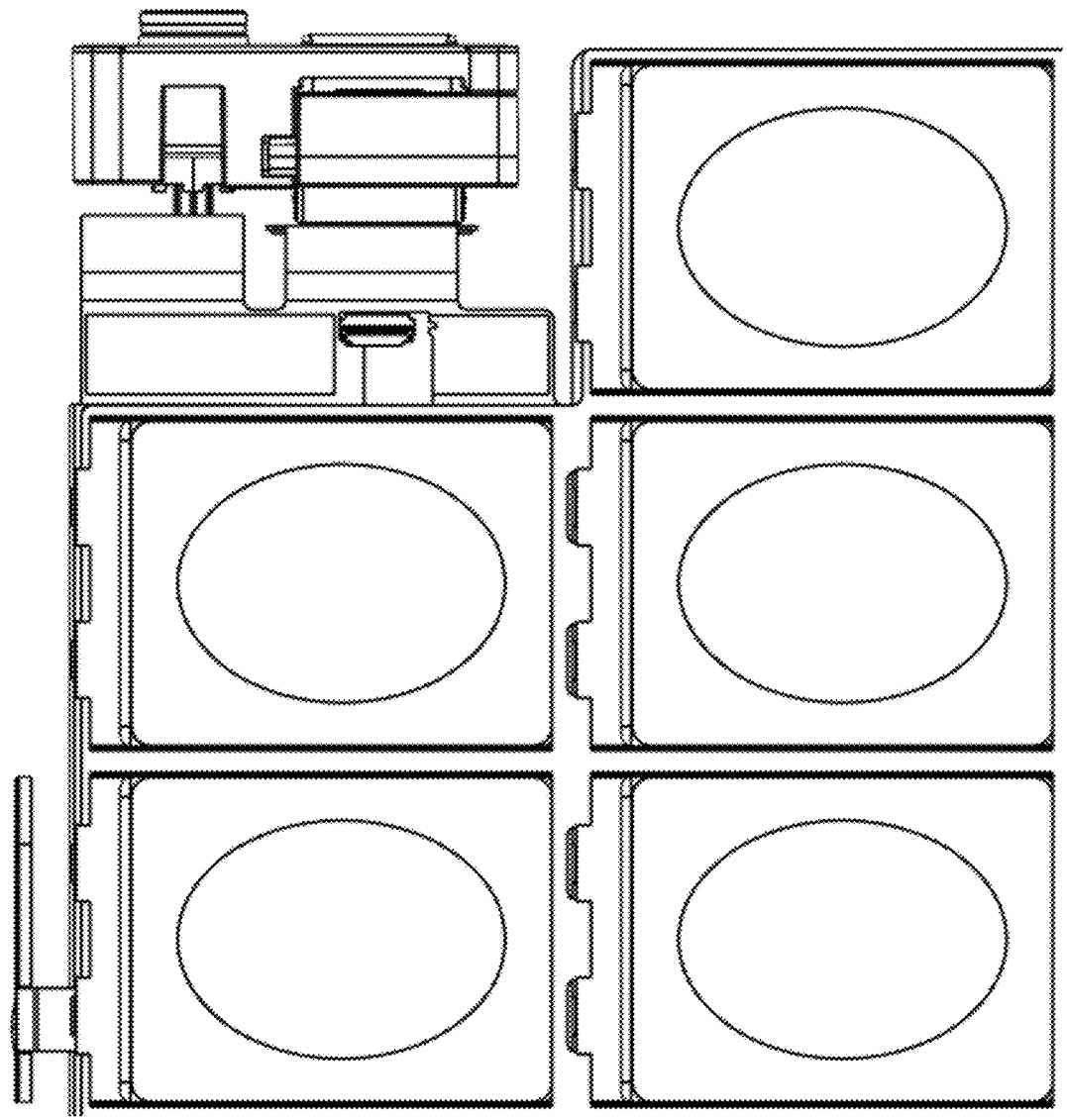
FIGS. 19 and 20 show partial views of the illustrative PCBA of opposite sides near the connector module, according to aspects of this disclosure.
Figure 20:
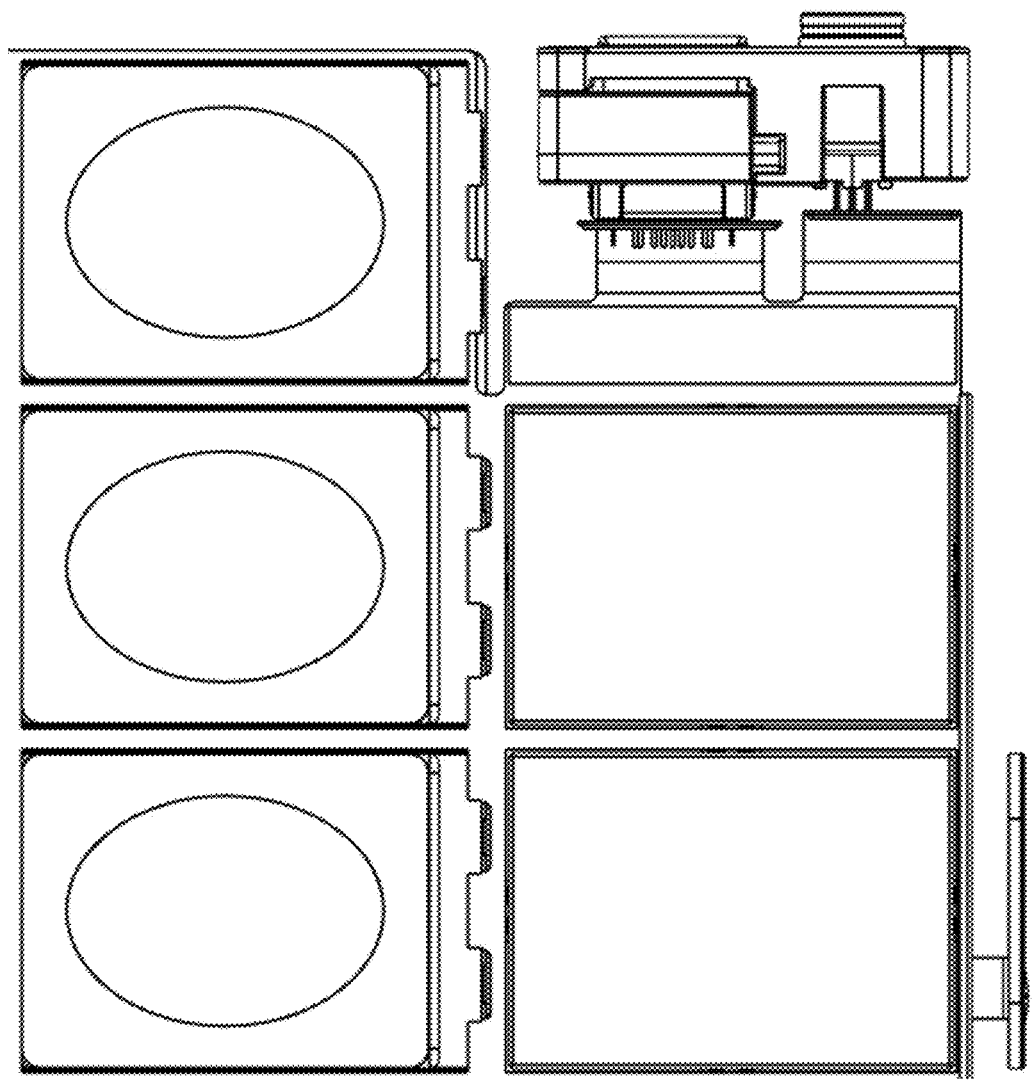

FIGS. 18A-18D show different side views of the flexible PCBA of FIGS. 16 and 17 from a perspective of each of four different edges according to aspects of this disclosure. For example, FIG. 18A shows a 3×2 matrix of battery cell modules with a connector module, FIGS. 18B and 18C show 4×2 and 5×2 matrices of battery cell modules, respectively, and FIG. 18D shows a 2×2 matrix 1810 of battery cell modules, a 2×2 matrix 1820 of battery cell modules and circuitry modules, and a connector interface 1830. FIGS. 19 and 20 show partial views of the illustrative PCBA 1600 of opposite sides near the connector module 170.

Figure 21:
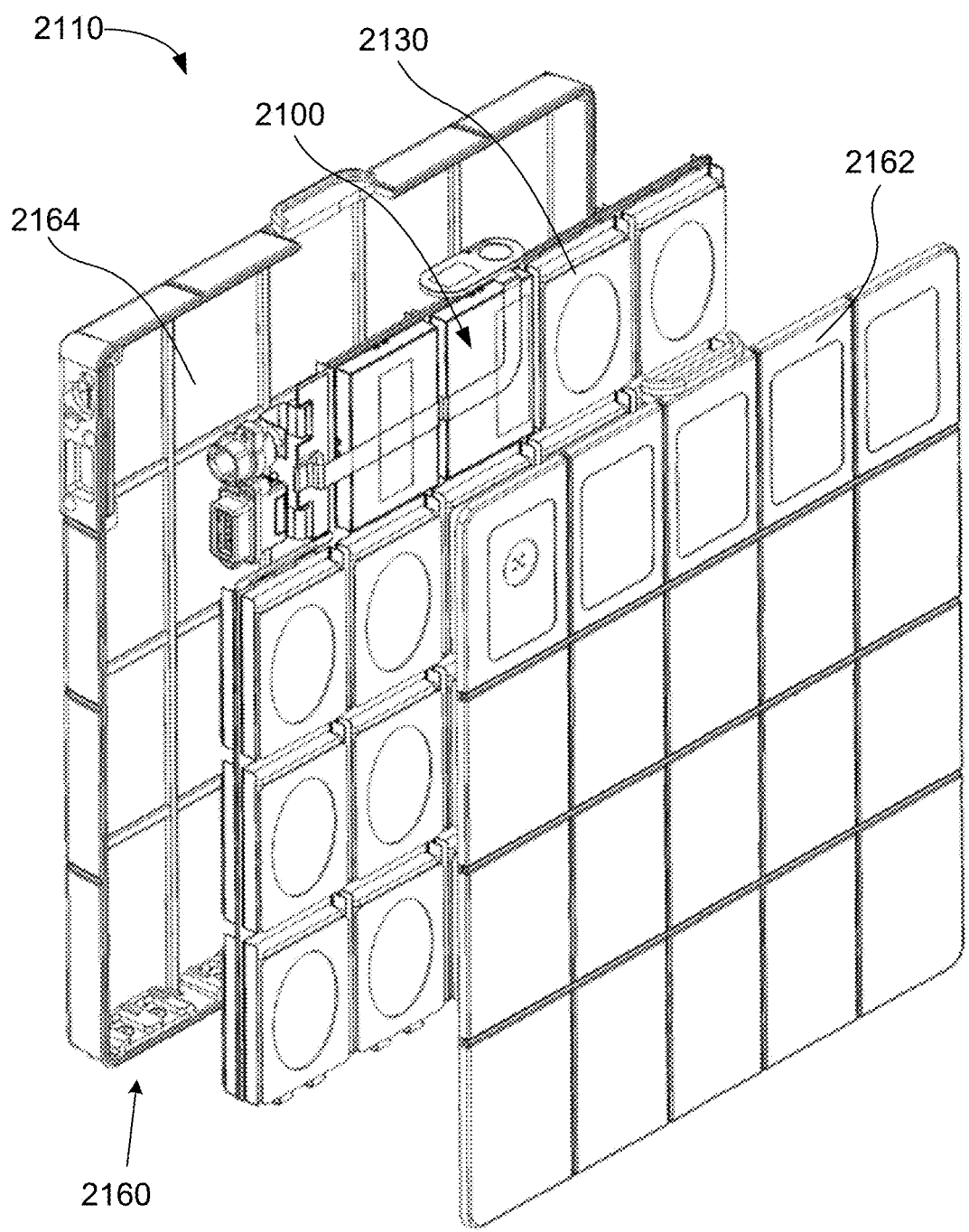
FIGS. 21 and 22 illustrate an illustrative conformal wearable battery (CWB) including a matrix of internal battery cell modules according to aspects of this disclosure.
Figure 22:
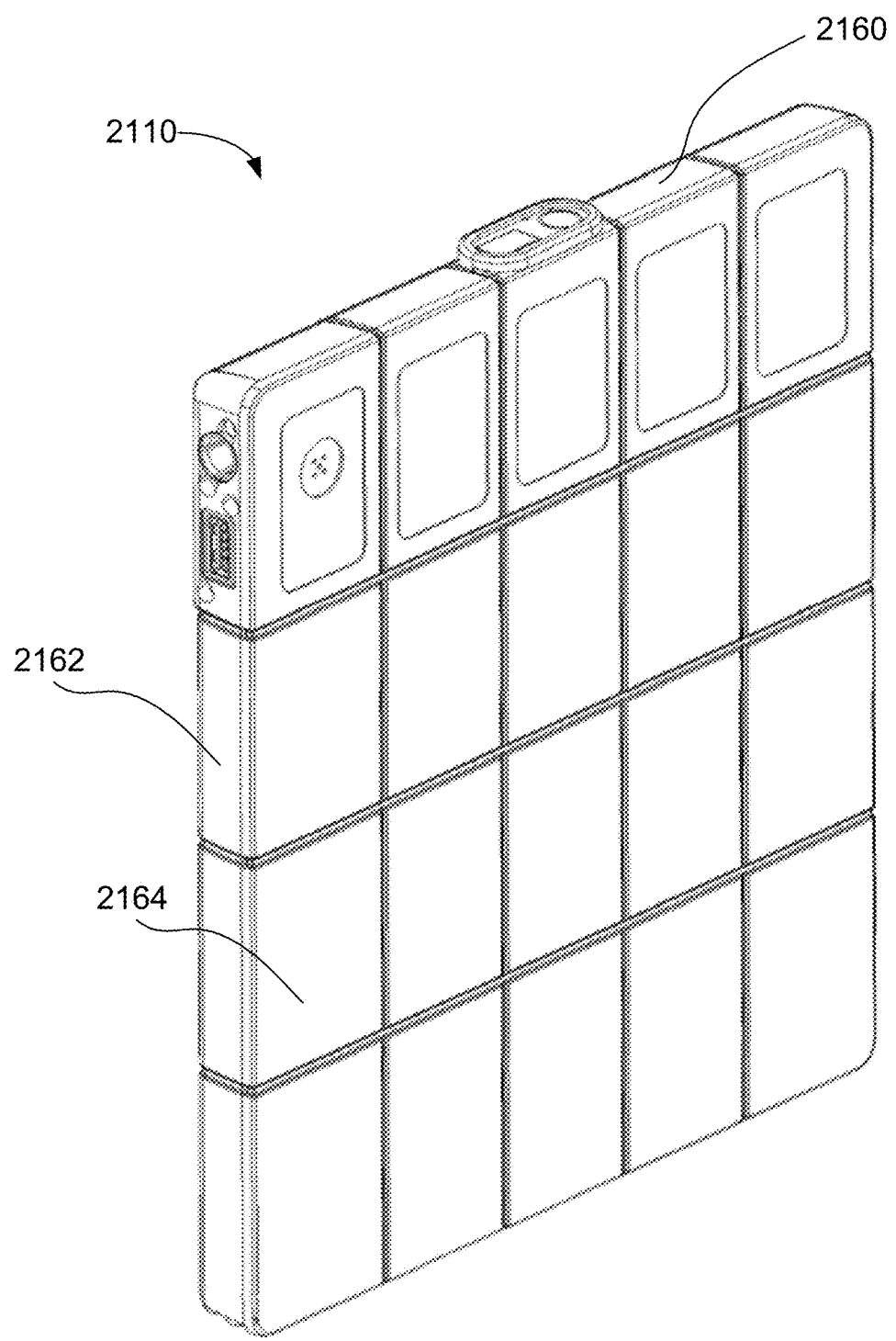

As shown in FIGS. 21 and 22, the battery cell assembly 2100 may be received into a housing 2160 to provide at least physical and/or environmental protection for the CWB 2110. The housing 2160 may include an upper housing member 2162 and a lower housing member 2164. The upper housing member 2162 and lower housing member 2164 may be connected together to form an interior cavity 2166, as shown in FIG. 21. In addition, the upper housing member 2162 and lower housing member 2164 may be sealed together along the perimeter to protect the battery cell assembly 2100 from to prevent ingress of solid material and/or liquid material. Accordingly, the CWB 2110 may meet the requirements of MIL-PRF-32383/4A. Each housing member 2162, 2164 may be formed from a polymeric material using a molding or other technique known to one skilled in the art.

The arrangement of the battery cell modules 2130 on the outward facing surfaces of the flexible PCBA 500 places the battery cell modules such that an outward facing surface of each battery cell module faces an interior surface of either the upper housing member 2162 or the lower housing member 2164. Additionally, a plurality of battery cell shock absorbing members may be individually attached to the outward facing surface of each battery cell. Each battery cell attenuating member may be positioned between the outward facing surface and one of the interior surfaces of the respective upper or lower housing members 2162, 2164.

Figure 23:
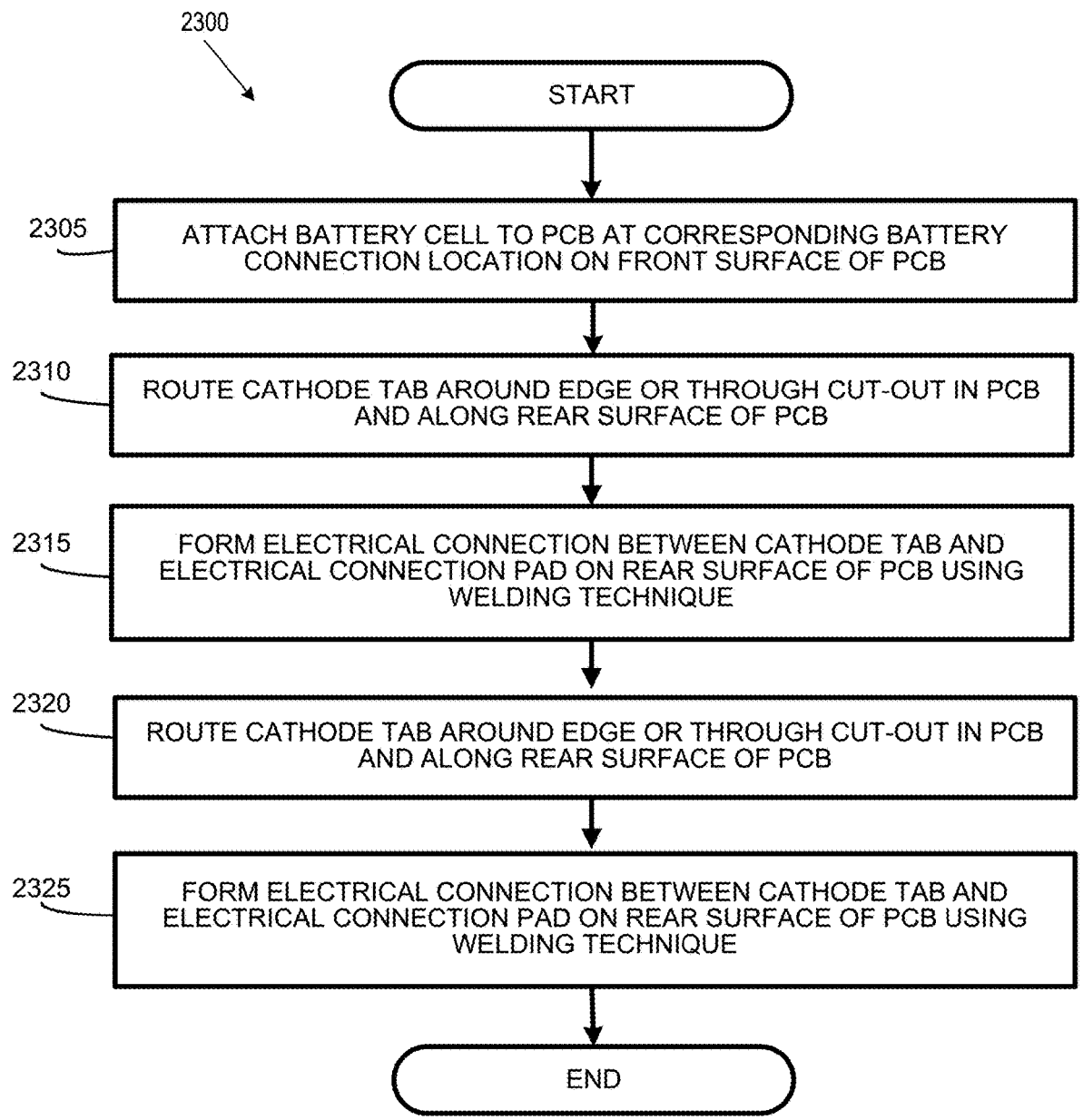
FIG. 23 shows an illustrative installation process for attaching each battery cell module to the flexible PCB according to aspects of this disclosure.

As discussed above, each battery cell may be connected to the flexible PCB 100 using a means to reduce the height profile, while also maximizing the density of the matrix of the battery cells. As shown in FIG. 23, the installation process 2300 for each battery cell module 2130 to the flexible PCB 100 may include multiple steps. As noted in step 2305, the battery cell module 2130 may be attached to a corresponding battery connection location 230 on one of the outward facing surfaces of the flexible PCB 100. The battery cell module 2130 may be attached using an adhesive (i.e. liquid adhesive, double-sided tape, or other similar method) that is positioned between the rear side of the battery cell of the battery cell module 2130 and the corresponding outward facing surface. When a tape is used, the tape may have a surface area similar to the surface area of the rear side of the battery cell of the battery cell 2130.

In step 2310, the cathode tab of each battery cell may be routed either to wrap around an edge of the flexible PCB 100 (if the battery cell module 2130 is located along an edge of the flexible PCB 100) or through a cut-out 140 (if the battery cell module 2130 is located away from an edge of the flexible PCB 100). The cathode tab is then formed or bent such that the cathode tab extends substantially parallel to a corresponding inward facing surface of the flexible PCB 100 and onto the appropriate electrical connection pad 150. In step 2315, an electrical connection may then be created between the cathode tab and the electrical connection pad 150 or its corresponding surface coating. The electrical connection may be formed using a technique to create an electrical connection between metal interfacing materials, such as ultrasonic welding, laser welding, or other appropriate welding technique. By using laser welding or ultrasonic welding, the different materials such a cathode tab that includes aluminum to an ENIG surface coating without additional filler materials which can help minimize the height, H1, of the tab to the rear surface of the flexible PCB 100 (e.g., an inward facing surface) of the flexible PCB 100. In steps 2320 and 2325, the steps of routing and connecting the cathode tab may be repeated for the anode tab of the battery cell module 2130 to complete the electrical connection for the battery cell 2130. In some examples, the anode tab may be routed and connected before the cathode tab. As another option, to accommodate a production environment, the attachment steps may be done as groupings such that all of the battery cell modules 2130 may be affixed with adhesive first, then the tabs may be routed appropriately, and then the tabs may be have the electrical connections formed using the appropriate welding technique (e.g., each battery connection tab 540, such as the cathode tab and/or the anode tab, may be welded individually in a sequence until all of the electrical connections are formed).

A CWB assembly may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing separate from other battery cells. A battery cell as described herein may include a plurality of individual battery cell elements that are electrically connected together to form a compound battery cell that electrically performs as a single unit. Each of the battery cell housings may be physically connected to adjacent battery cell housings by flexible elements (e.g., a flexible printed circuit board), thereby facilitating a surface outline or shape of the array of battery cells to generally conform to a surface outline or shape of a user wearing the CWB assembly. One or more of the battery cell housings may include a positive-charge electrical terminal and a negative-charge electrical terminal that are electrically connected with the battery cell within an interior of the battery cell housing and provide electrical power to electrical devices disposed exterior to the battery cell housing. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB assembly may include a set of positive-charge and negative-charge electrical terminals that are shared among the plurality of the battery cells of the array of battery cells. The plurality of the battery cells may be electrically coupled together, for example, in series or in parallel.

While aspects of the disclosure have been described with reference to battery cells and/or a CWB comprising battery cells, arrangements and methods as described herein may also be applied to other devices and systems having a flexible PCBA to maximize space within a housing. For example, the arrangements and methods described herein may apply to any electronic device disposed within a housing for which maximizing usable interior space within a housing by folding a flexible PCBA within the available interior space is desired. Examples of such electronic devices may include underwater cameras, sonar devices, radar devices, lidar devices, emergency radio beacons, satellite communications devices, terrestrial wireless communications devices, global positioning system (GPS) receivers, electronic environmental sensor devices, electronic medical devices, computing processors, solar cell based power generation devices, wave motion based power generation devices, fuel cell based power generation devices, battery charging controllers, and/or portable chemical batteries for powering electronic or electrical devices.

In an illustrative example, a conformal wearable battery may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

The conformal wearable battery of the illustrative example may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

The conformal wearable battery may include a plurality of battery cells, at least one circuitry module configured to control and monitor charging and discharging of the plurality of battery cells, and a flexible printed circuit board assembly (PCBA). The flexible PCBA may include a plurality of physical connection sections disposed in a grid like pattern, wherein each of the plurality of battery cells and the at least one circuitry module is physically affixed to the flexible PCBA at a corresponding physical connection section of the plurality of physical connection sections.

The conformal wearable battery of the illustrative example may include a flexible PCBA that includes a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

The conformal wearable battery of the illustrative example may include a plurality of battery cells and at least one circuitry module that, when affixed to the flexible PCBA, forms a matrix of physical components. The matrix of physical components may be a matrix of at least two rows and at least two columns.

The conformal wearable battery of the illustrative example may further include at least one connector configured to provide an electrical power connection from internal circuitry of the conformal wearable battery to an external device to be powered.

The conformal wearable battery of the illustrative example may include the plurality of battery cells, where the at least one connector, and the at least one circuitry module, when affixed to the flexible PCBA, comprises a matrix of physical components.

The conformal wearable battery of the illustrative example may comprise a bend axis that is a center of the grid like pattern of the physical connection sections when the flexible PCBA is unfolded. The conformal wearable battery of the illustrative example may include a flexible PCBA having each of the plurality of battery cells physically attached to a first side of the flexible PCBA. The conformal wearable battery of the illustrative example may include the flexible PCBA having each of the plurality of battery cells physically attached to a first side of the flexible PCBA and each of the plurality of battery cells electrically connected to the flexible PCBA on a second side of the flexible PCBA that is opposite the first side. The conformal wearable battery of the illustrative example may include the flexible PCBA having the plurality of battery cells disposed on an outside surface of the flexible PCBA, when the flexible PCBA is in a folded configuration.

The conformal wearable battery of the illustrative example may include a plurality of battery cells that are arranged in a three-dimensional grid pattern. The conformal wearable battery of the illustrative example may include a sealed flexible housing wherein the flexible PCBA is disposed within an interior cavity of the sealed flexible housing and wherein the flexible PCBA is in a folded configuration.

An illustrative system may include a plurality of battery cell modules and a flexible printed circuit board assembly (PCBA). The flexible PCBA may further include a plurality of battery cell connection sections disposed in a grid-like pattern along a first surface of the flexible PCBA where each of the plurality of battery cell modules is electrically attached to the flexible PCBA on a second surface of the flexible PCBA in a grid-like pattern, wherein the second surface is opposite the first surface.

The illustrative system may further include a housing, wherein the flexible PCBA, when in a folded configuration, is located within the housing.

The illustrative system may include a plurality of battery cell modules, where each of the plurality of battery cell modules includes a battery cell and an attenuating member made of a resilient material. Each battery cell may be a lithium-ion battery cell. The illustrative system may include a plurality of battery cells arranged in a three-dimensional grid pattern when the flexible PCBA is in a folded configuration.

An illustrative flexible printed circuit board assembly (PCBA) may include a plurality of battery modules physically affixed to the flexible PCBA, where the plurality of battery modules is arranged in a grid-like pattern and a bend axis near an approximate mid-point of the flexible PCBA. When the flexible PCBA is bent along the bend axis, the flexible PCBA is in a folded configuration and, when the flexible PCBA is in a folded configuration, the plurality of battery modules is disposed in a three-dimensional grid-like pattern.

The illustrative flexible PCBA may include a plurality of flexible sections, wherein the flexible sections allow for the flexible PCBA to flex between adjacent rows and adjacent columns of battery modules. The illustrative flexible PCBA may include at least one circuitry module that comprises a portion of the grid-like pattern.

A conformal wearable battery may include a plurality of battery cells and a flexible printed circuit board (PCB). In some cases, each battery cell may include a pair of electrically conductive elements that correspond to either a cathode or an anode of each battery cell. The flexible PCB may include a plurality of physical connection sections disposed in a grid-like pattern on a first side of the flexible PCB, were each of the plurality of battery cells may be disposed associated with a corresponding physical connection section of the plurality of physical connection sections. The flexible PCB may include a plurality of electrical connection pads linearly disposed on a second side opposite the first side of the flexible PCB, where the plurality of electrical connection pads may include an electrically conductive surface coating. The electrically conductive surface coating may comprise an electroless nickel immersion gold (ENIG) surface coating and/or a lead-free immersion silver surface coating.

In some cases, the pair of electrically conductive elements may extend substantially parallel to and along the second side of the flexible PCB and each of the electrically conductive elements may be connected to a corresponding electrical connection pad of the plurality of electrical connection pads on the second side of the flexible PCB forming an electrical connection.

In some cases, the conformal wearable battery may include a plurality of battery cells that may be configured as pouch cell packaged polymer lithium-ion batteries Each battery cell of the plurality of battery cells may be physically attached to the first side of the flexible PCB.

In some cases, the flexible PCB of the conformal wearable battery may include a plurality of cutouts extending through the flexible PCB, wherein at least one cutout of the plurality of cutouts is located adjacent to an electrical connection pad of the plurality of electrical connection pads. Each conductive element of the pair of electrically conductive elements may extend through a corresponding cutout of the plurality of cutouts. In some cases, the electrical connection between each electrically conductive element of the pair of electrically conductive elements and the corresponding electrical connection pad of the plurality of electrical connection pads may be joined with a weld, such as by using one or more of a laser welding process and/or an ultrasonic welding process.

In some cases, a connection pad of the plurality of electrical connection pads may have a width that is within a range of 1.8 times and 3 times a width of an electrically conductive element of the pair of electrically conductive elements and/or a height electrical connection may be within a range of 10% to 70% of a thickness of an electrically conductive element of the pair of electrically conductive elements.

In some cases, a system may include a first plurality of battery cells, wherein a first battery cell of the first plurality of battery cell includes a first pair of electrically conductive elements and a second plurality of battery cell, wherein a second battery cell of the second plurality of battery cell includes a second pair of electrically conductive elements, and may also include a flexible printed circuit board (PCB). The flexible PCB may include a plurality of battery cell connection sections disposed in a grid-like pattern along a first surface of the flexible PCB, a plurality of cutouts disposed adjacent and parallel to an edge of the plurality of battery cell connection sections, where the plurality of cutouts is arranged as multiple pairs of cutouts arranged adjacent a majority of the plurality of battery cell connection sections. The flexible PCB may also include a plurality of electrical connection pads disposed on a second surface of the flexible PCB opposite the first surface, where a majority of the plurality of electrical connection pads may be arranged adjacent the plurality of cutouts and the plurality of electrical connection pads may include an electrically conductive surface coating. In some cases, an electrically conductive element of the first pair of electrically conductive elements may wrap around an edge of the flexible PCB and may extend along the second surface of the flexible PCB. The electrically conductive element of the first pair of electrically conductive elements may connect to a corresponding electrical connection pad of the plurality of electrical connection pads forming a first electrical connection and an electrically conductive element of the second pair of electrically conductive elements may extend through a cutout of the plurality of cutouts such that each electrically conductive element of the second pair of electrically conductive elements connects to a corresponding electrical connection pad of the plurality electrical connection pads forming a second electrical connection.

In some cases, the system may further include the first electrical connection between the electrically conductive element of the first pair of electrically conductive elements and the corresponding electrical connection pad of the plurality of electrical connection pads may be joined with a weld, such as by using a laser welding process and/or using an ultrasonic welding process. In some cases, the connection pad of the plurality of electrical connection pads may have a circular shape with a diameter that is within a range of 1.8 times and 3 times a width of an electrically conductive element of the pair of electrically conductive elements.

In some cases, a flexible printed circuit board assembly (PCBA) may include a flexible printed circuit board (PCB) that may include a first side and a second side opposite the first side. The flexible PCBA may further include a plurality of electrical connection pads disposed on the second side of the flexible PCB, where the plurality of electrical connection pads may be arranged in multiple pairs of electrical connection pads and the plurality of electrical connection pads may include an electrically conductive surface coating. In some cases, the flexible PCBA may include a plurality of cutouts linearly disposed in the flexible PCB and adjacent to corresponding electrical connection pads and a plurality of battery cell modules physically affixed to the first side of the flexible PCB, were the plurality of battery cell modules may be arranged in a grid-like pattern and may include pouch cell packaged polymer lithium-ion material. In some cases, each battery cell module of the plurality of battery cell modules may include a pair of electrically conductive elements that extend substantially parallel to the second side of the flexible PCB and connect to corresponding electrical connection pads of the plurality of electrical connection pads forming an electrical connection for each battery cell module. In some cases, the electrical connection between each electrically conductive elements of the pair of electrically conductive elements and the corresponding electrical connection pads of the plurality of electrical connection pads may be formed using a welding process. In some cases, a connection pad of the plurality of electrical connection pads may have a circular shape with a diameter that is within a range of 1.8 times and 3 times a width of an electrically conductive element of the pair of electrically conductive elements. In some cases, each electrical connection pad of the plurality of electrical connection pads may include an electroless nickel immersion gold (ENIG) surface coating.

Aspects of the disclosure have been described in terms of illustrative examples thereof. Numerous other examples, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

What is claimed is:

1. A conformal wearable battery comprising:
   a plurality of battery cells, each battery cell of the plurality of battery cells comprising:
      a lithium-ion pouch cell; and
      a plurality of attenuating members, each attenuating member affixed to an exterior surface of the lithium-ion pouch cell;
   at least one circuitry module configured to control charging of the plurality of battery cells, wherein the plurality of battery cells comprises a first battery cell and a second battery cell; and
   a flexible printed circuit board assembly (PCBA) comprising:
      a plurality of physical connection sections disposed in a grid like pattern, wherein each of the plurality of battery cells and the at least one circuitry module is physically affixed to the flexible PCBA at a corresponding physical connection section of the plurality of physical connection sections;
      a plurality of flexible regions distributed between the physical connection sections disposed in the grid like pattern, wherein the plurality of flexible regions allows the conformal wearable battery to flex in response to an applied force;
      a plurality of electrical connection pad pairs, wherein each pad pair of the plurality of electrical connection pad pairs is positioned parallel to an edge of the flexible PCBA and is associated with a corresponding physical connection section, wherein each pad pair of the plurality of electrical connection pad pairs is positioned adjacent and parallel to a corresponding flexible region, wherein the plurality of electrical connection pad pairs comprises a first electrical connection pad pair and a second electrical connection pad pair and wherein the first electrical connection pad pair is linearly aligned with the second electrical connection pad pair;
      a pair of cutouts in the flexible PCBA through which a first pair of electrically conductive elements of the first battery cell extend, wherein the first pair of electrically conductive elements of the first battery cell are electrically connected to the first electrical connection pad pair; and
      an edge of the flexible PCBA around which a second pair of electrically conductive elements of the second battery cell wraps, wherein the second pair of electrically conductive elements of the second battery cell are electrically connected to adjacent pads of the second electrical connection pad pair.

2. The conformal wearable battery of claim 1, wherein the flexible PCBA comprises a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

3. The conformal wearable battery of claim 1, wherein the plurality of battery cells and the at least one circuitry module, when affixed to the flexible PCBA, comprises a matrix of physical components.

4. The conformal wearable battery of claim 3, wherein the matrix of physical components comprises a matrix of at least two rows and at least two columns.

5. The conformal wearable battery of claim 1, wherein the conformal wearable battery comprises at least one connector configured to provide an electrical power connection from internal circuitry of the conformal wearable battery to an external device to be powered.

6. The conformal wearable battery of claim 5, wherein the plurality of battery cells, the at least one connector, and the at least one circuitry module, when affixed to the flexible PCBA, comprises a matrix of physical components.

7. The conformal wearable battery of claim 1, wherein a bend axis comprises a center of the grid like pattern of the physical connection sections when the flexible PCBA is unfolded.

8. The conformal wearable battery of claim 1, wherein each of the plurality of battery cells is physically attached to a first side of the flexible PCBA.

9. The conformal wearable battery of claim 1, wherein each of the plurality of battery cells is physically attached to a first side of the flexible PCBA and each of the plurality of battery cells is electrically connected to the flexible PCBA on a second side of the flexible PCBA, the second side being opposite the first side.

10. The conformal wearable battery of claim 1, wherein the plurality of battery cells is disposed on an outside surface of the flexible PCBA, when the flexible PCBA is in a folded configuration.

11. The conformal wearable battery of claim 10, wherein the plurality of battery cells is arranged in a three-dimensional grid pattern.

12. The conformal wearable battery of claim 1, further comprising a sealed flexible housing wherein the flexible PCBA is disposed within an interior cavity of the sealed flexible housing and wherein the flexible PCBA is in a folded configuration.

13. A system comprising:
a plurality of battery cell modules comprising a first battery cell module and a second battery cell module, wherein each battery cell module of the plurality of battery cell modules comprises:
a lithium-ion pouch cell comprising a cathode tab and an anode tab; and
an attenuating member affixed to an exterior surface of the lithium-ion pouch cell; and
a flexible printed circuit board assembly (PCBA) comprising:
a plurality of battery cell connection sections disposed in a grid-like pattern along a first surface of the flexible PCBA; and
a plurality of electrical connection pad pairs comprising a first pad pair and a second pad pair, wherein each pad pair of the plurality of electrical connection pad pairs is associated with a corresponding battery cell connection section, is positioned parallel to an edge of the flexible PCBA, and is positioned parallel to a corresponding flexible region of the flexible PCBA, wherein each of the plurality of battery cell modules is electrically attached to the flexible PCBA on a second surface of the flexible PCBA in a grid-like pattern via a corresponding pad pair, wherein the second surface is opposite the first surface and wherein the first electrical connection pad pair is linearly aligned with the second electrical connection pad pair;
wherein the flexible PCBA comprises a pair of cutouts through which a first cathode tab and a first anode tab of the first battery cell module extend, wherein the first cathode tab and the first anode tab are electrically connected to the first pad pair; and
wherein the flexible PCBA comprises an edge around which a second cathode tab and a second anode tab of the second battery cell module wrap, wherein the second cathode tab and the second anode tab are electrically connected to the second pad pair.

14. The system of claim 13, further comprising a housing, wherein the flexible PCBA, when in a folded configuration, is located within the housing.

15. The system of claim 13, wherein a center line of the attenuating member of each of the plurality of battery cell modules is offset from a center line of the lithium-ion pouch cell.

16. The system of claim 14, wherein a first portion of the second surface of the flexible PCBA faces a second portion of the second surface when the flexible PCBA is in the folded configuration.

17. The system of claim 13, wherein the plurality of battery cell modules is arranged in a three-dimensional grid pattern when the flexible PCBA is in a folded configuration.

18. A flexible printed circuit board assembly (PCBA) comprising:
a plurality of battery modules physically affixed to the flexible PCBA, wherein the plurality of battery modules is arranged in a grid-like pattern, wherein a first battery module is physically affixed to the flexible PCBA adjacent to a second battery module and wherein each battery module of the plurality of battery modules comprises:
a lithium-ion pouch cell; and
an attenuating member affixed to an exterior surface of the lithium-ion pouch cell;
a bend axis near an approximate mid-point of the flexible PCBA, wherein bending the flexible PCBA along the bend axis results in a folded configuration of the flexible PCBA;
wherein, when the flexible PCBA is in the folded configuration, the plurality of battery modules is disposed in a flexible three-dimensional grid-like pattern on an exterior surface of the folded flexible PCBA,
wherein the plurality of battery modules is electrically connected to the flexible PCBA via a plurality of electrical connection pads disposed parallel and adjacent to a flexible section between adjacent rows of battery modules of the grid-like pattern, wherein the electrical connection pads are on an interior surface of the folded flexible PCBA, and wherein each pad pair of the plurality of electrical connection pads is positioned parallel to an edge of the flexible PCBA and is associated with a corresponding physical connection section; and
wherein first electrical connection tabs of the first battery module extend through a pair of cutouts in the flexible PCBA and wherein the first electrical connection tabs are electrically connected to a first pair of electrical connection pads of the plurality of electrical connection pads; and wherein second electrical connection tabs of the second battery module wrap around an edge of the flexible PCBA and wherein the second electrical connection tabs are electrically connected to a second pair of electrical connection pads of the plurality of electrical connection pads.

19. The flexible PCBA of claim 18, further comprising a plurality of flexible sections, wherein the plurality of the flexible sections allows the flexible PCBA to flex between adjacent rows and adjacent columns of battery modules.

20. The flexible PCBA of claim 18, comprising at least one circuitry module that comprises a portion of the grid-like pattern.

* * * * *